(12) United States Patent
Ken et al.

(10) Patent No.: US 8,318,412 B2
(45) Date of Patent: Nov. 27, 2012

(54) METHOD OF MANUFACTURING SEMICONDUCTOR DEVICE

(75) Inventors: Tokashiki Ken, Seongnam-si (KR); Chul-ho Shin, Yongin-si (KR); Sang-Kuk Kim, Seoul (KR); Do-haing Lee, Hwaseong-si (KR); Dong-seok Lee, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 184 days.

(21) Appl. No.: 12/871,251

(22) Filed: Aug. 30, 2010

(65) Prior Publication Data
US 2011/0159442 A1 Jun. 30, 2011

(30) Foreign Application Priority Data
Dec. 31, 2009 (KR) .................. 10-2009-0136215

(51) Int. Cl.
*G03F 7/26* (2006.01)
(52) U.S. Cl. ................ 430/315; 430/384
(58) Field of Classification Search .......... 430/323, 430/324, 314, 315, 394
See application file for complete search history.

(56) References Cited

U.S. PATENT DOCUMENTS

| 5,679,499 | A | 10/1997 | Yamamori |
| 6,664,028 | B2* | 12/2003 | Hwang et al. .............. 430/312 |
| 6,911,399 | B2 | 6/2005 | Liu et al. |
| 7,241,683 | B2* | 7/2007 | Hudson et al. ............. 438/637 |
| 2010/0130015 | A1* | 5/2010 | Nakajima et al. .......... 438/703 |

FOREIGN PATENT DOCUMENTS

| JP | 03-259932 | * 11/1991 |
| JP | 08227873 | 9/1996 |
| JP | 2005-175259 | * 6/2005 |
| KR | 100272520 | 8/2000 |

* cited by examiner

*Primary Examiner* — Cynthia Kelly
*Assistant Examiner* — Caleen Sullivan
(74) *Attorney, Agent, or Firm* — Onello & Mello, LLP

(57) ABSTRACT

A semiconductor device is manufactured by a method including processes of trimming and molding resist patterns. A resist layer formed on a substrate is exposed and developed to form the resist patterns. The resist patterns are trimmed using a first gas plasma to change the profiles of the resist patterns. Widths of the trimmed resist patterns are increased using a second gas plasma to form processed resist patterns.

11 Claims, 26 Drawing Sheets

FIG. 14

| SECOND GAS PLASMA TREATMENT TIME | PRE-TREATMENT (AFTER FIRST GAS PLASMA TREATMENT FOR 20 SECONDS) | 12 SECONDS | 24 SECONDS | 36 SECONDS | 60 SECONDS |
|---|---|---|---|---|---|
| UPPER SURFACE | | | | | |
| PROFILES OF SECOND RESIST PATTERNS | | | | | |
| AVERAGE CDs OF HOLE AREAS | 54.94 nm | 48.03 nm | 45.86 nm | 40.98 nm | 36.71 nm |

FIG. 18

| INVENTIVE CONCEPT | PRE-TREATMENT | FIRST EMBODIMENT | SECOND EMBODIMENT (I) $O_2$=0 sccm, DC=900V | SECOND EMBODIMENT (II) $O_2$=0 sccm, DC=300V | SECOND EMBODIMENT (III) $O_2$=5 sccm, DC=900V |
|---|---|---|---|---|---|
| UPPER SURFACE × 150k | | | | | |
| PROFILES OF SECOND RESIST PATTERNS × 200k | | | | | |
| AVERAGE CDs | 49.85 nm | 47.86 nm | 45.71 nm | 43.03 nm | 42.77 nm |
| CD SCATTERING | 9.47 nm | 6.64 nm | 5.87 nm | 6.47 nm | 4.68 nm |

METHOD OF MANUFACTURING SEMICONDUCTOR DEVICE

CROSS-REFERENCE TO RELATED APPLICATIONS

This application claims the benefit of Korean Patent Application No. 10-2009-0136215, filed on Dec. 31, 2009, in the Korean Intellectual Property Office, the disclosure of which is incorporated herein in its entirety by reference.

BACKGROUND

The inventive concept relates to a method of manufacturing a semiconductor device, and more particularly, to a method of manufacturing a semiconductor device using resist patterns.

When resist patterns are formed using a chemically amplified photoresist material in a photolithographic process using a light source producing light with a wavelength of 193 nm or less, undesired resist residues, such as scum or foot, are easily formed or undesired profiles are easily formed. In particular, resist residues or poor profiles are further formed in a photolithographic process for forming fine patterns having 30 nm design rules.

SUMMARY

The inventive concept provides a method of manufacturing a semiconductor device by which fine-size resist patterns having fine profiles and high tolerances to dry etching are formed without leaving undesired resist residues in the fine-size resist patterns by using a photolithographic process using a light source producing light with a wavelength of 193 nm or less.

According to an aspect of the inventive concept, there is provided a method of manufacturing a semiconductor device. A resist layer formed on a substrate may be exposed and developed to form resist patterns. The resist patterns may be trimmed using a first gas plasma to change profiles of the resist patterns. Widths of the trimmed resist patterns may be increased using a second gas plasma to form processed resist patterns.

The resist patterns may be exposed to plasma vacuum-ultraviolet (VUV) rays having a wavelength smaller than 150 nm to change the profiles of the resist patterns and to form the processed resist patterns.

The change of the profiles of the resist patterns and the formation of the processed resist patterns may be sequentially performed, and the first and second gas plasmas may be obtained from different gas mixtures. The first gas plasma may be plasma that is obtained from a mixture of at least one first gas and at least one second gas, wherein the at least one first gas is selected from the group consisting of $H_2$, $N_2$, $NH_3$, $O_2$, CO, $CO_2$, and carbonyl sulfide (COS); and the at least one second gas is selected from the group consisting of He, Ar, Kr, and Xe. The second gas plasma may be plasma that is obtained from a mixture of at least one first gas, at least one second gas, and a third gas, wherein the at least one first gas is selected from the group consisting of $H_2$, $N_2$, $NH_3$, $O_2$, CO, $CO_2$, and COS; the at least one second gas is selected from the group consisting of He, Ar, Kr, and Xe; and the third gas comprises $C_xH_yF_z$ (where x, y, and z are each an integer between 1 and 10). The first gas plasma may be obtained from a mixture of $H_2$ and Ar gases, and the second gas plasma may be obtained from a mixture of $H_2$, Ar, and $CF_4$ gases.

The change of the profiles of the resist patterns and the formation of the processed resist patterns may be simultaneously performed, and the first and second gas plasmas may be obtained from an identical gas mixture. Each of the first and second gas plasmas may be plasma that is obtained from a mixture of at least one first gas, at least one second gas, and a third gas, wherein the at least one first gas is selected from the group consisting of $N_2$, $NH_3$, $O_2$, CO, $CO_2$, and COS; the at least one second gas is selected from the group consisting of He, Ar, Kr, and Xe; and the third gas comprises $C_xH_yF_z$ (where x, y, and z are each an integer between 1 and 10). Each of the first and second gas plasmas may be obtained from a mixture of COS, Ar, and $CF_4$ gases. The mixture further may include $O_2$.

The resist patterns may include first and second resist patterns, which have different layouts. The formation of the resist patterns may include: forming a first resist layer on the substrate; exposing and developing the first resist layer to form the first resist patterns having a first layout; forming a second resist layer on the substrate and the first resist patterns; and exposing and developing the second resist layer to form the second resist patterns having a second layout on the substrate.

The first resist patterns may include a plurality of first patterns that are formed along a plurality of first lines extending in a first direction on the substrate. The second resist patterns may include a plurality of second patterns that are formed along a plurality of second lines intersecting with the plurality of first lines on the substrate. A plurality of hole areas may be defined on the substrate by the plurality of first patterns and the plurality of second patterns.

According to another aspect of the inventive concept, there is provided a method of manufacturing a semiconductor device. A plurality of first resist patterns may be formed on a substrate along a plurality of first lines. A plurality of second resist patterns may be formed on the substrate along a plurality of second lines intersecting with the plurality of first lines. The first and second resist patterns may be exposed to first gas plasma and first plasma VUV rays to trim the first and second resist patterns. The trimmed first and second resist patterns may be exposed to second gas plasma and second plasma VUV rays to form densified first resist patterns and densified second resist patterns.

According to another aspect of the inventive concept, there is provided a method of manufacturing a semiconductor device. A first layer may be formed on a substrate. A plurality of first resist patterns may be formed on the first layer along a plurality of first lines. A plurality of second resist patterns may be formed on the first layer along a plurality of second lines intersecting with the plurality of first lines to define a plurality of hole areas by the plurality of first resist patterns and the plurality of second resist patterns, wherein the plurality of hole areas expose the first layer. The first and second resist patterns may be exposed to first gas plasma and first plasma VUV rays to change profiles of the plurality of hole areas. The first and second resist patterns may be exposed to second gas plasma and second plasma VUV rays to form densified first resist patterns and densified second resist patterns and reduce sizes of the plurality of hole areas. The first layer may be etched using the densified first and second resist patterns as etching masks to form a plurality of holes in the first layer.

After the plurality of holes are formed in the first layer, the method may further include forming a plurality of capacitor lower electrodes on inner walls of the plurality of holes.

After the plurality of holes are formed in the first layer, the method may further include forming a plurality of contact plugs in the plurality of holes.

BRIEF DESCRIPTION OF THE DRAWINGS

Exemplary embodiments of the inventive concept will be more clearly understood from the following detailed description taken in conjunction with the accompanying drawings in which:

FIG. 14 is a graph illustrating results of evaluating changes in resist patterns with respect to times during which the resist patterns are treated using second gas plasma, in the manufacturing method described with reference to FIGS. 2A through 6B;

FIG. 18 is a graph illustrating results of evaluating changes in resist patterns obtained by treating the resist patterns using gas plasma according to various methods according to embodiments of the inventive concept.

DETAILED DESCRIPTION OF THE EMBODIMENTS

Figure 1:
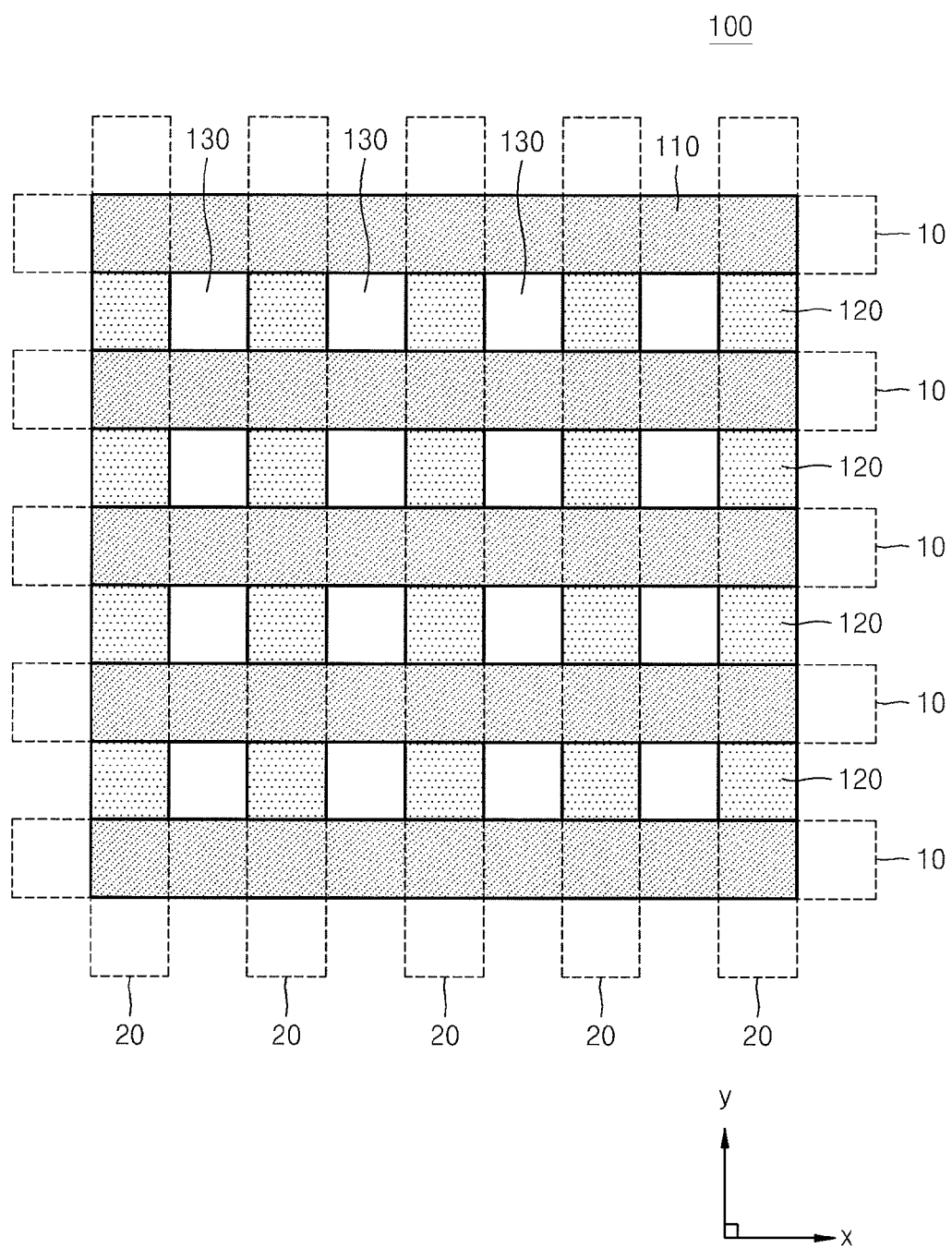
FIG. 1 illustrates a layout of resist patterns for forming fine patterns in a method of manufacturing a semiconductor device according to embodiments of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to those skilled in the art. In the drawings, the thicknesses of layers and regions are exaggerated for clarity. Also, various types of elements and regions are schematically illustrated in the drawings. The inventive concept is, therefore, not limited to relative sizes or intervals illustrated in the attached drawings. Like reference numerals in the drawings denote like elements.

FIG. 1 illustrates a layout of resist patterns for forming fine patterns in a method of manufacturing a semiconductor device according to embodiments of the inventive concept.

A resist pattern 100 includes first and second resist patterns 110 and 120 having different layouts. The first resist patterns 110 may be a plurality of patterns that are formed along a plurality of first lines 10 (marked with dotted lines in FIG. 1) extending in a first direction (e.g., a direction "x" in FIG. 1). The second resist patterns 120 may be a plurality of patterns that are formed among the plurality of first lines 10 along a plurality of second lines 20 (marked with dotted lines in FIG. 1) intersecting with the plurality of first lines 10. As illustrated in FIG. 1, the plurality of second lines 20 may extend in a second direction (e.g., a direction "y" in FIG. 1) orthogonal to the first direction.

A plurality of hole areas 130 are defined by the first and second resist patterns 110 and 120.

FIGS. 2A through 6B are plan views and cross-sectional views illustrating a method of manufacturing a semiconductor device according to an embodiment of the inventive concept. FIGS. 2B, 3B, 4B, 5B, and 6B illustrate cross-sectional views taken along lines Xb-Xb' and Yb-Yb' of FIGS. 2A, 3A, 4A, 5A, and 6A, respectively.

Like reference numerals in FIGS. 2A through 6B denote like elements in FIG. 1. Therefore, the descriptions of the like elements with reference to FIG. 1 are likewise applicable to the current embodiment.

Figure 2A:
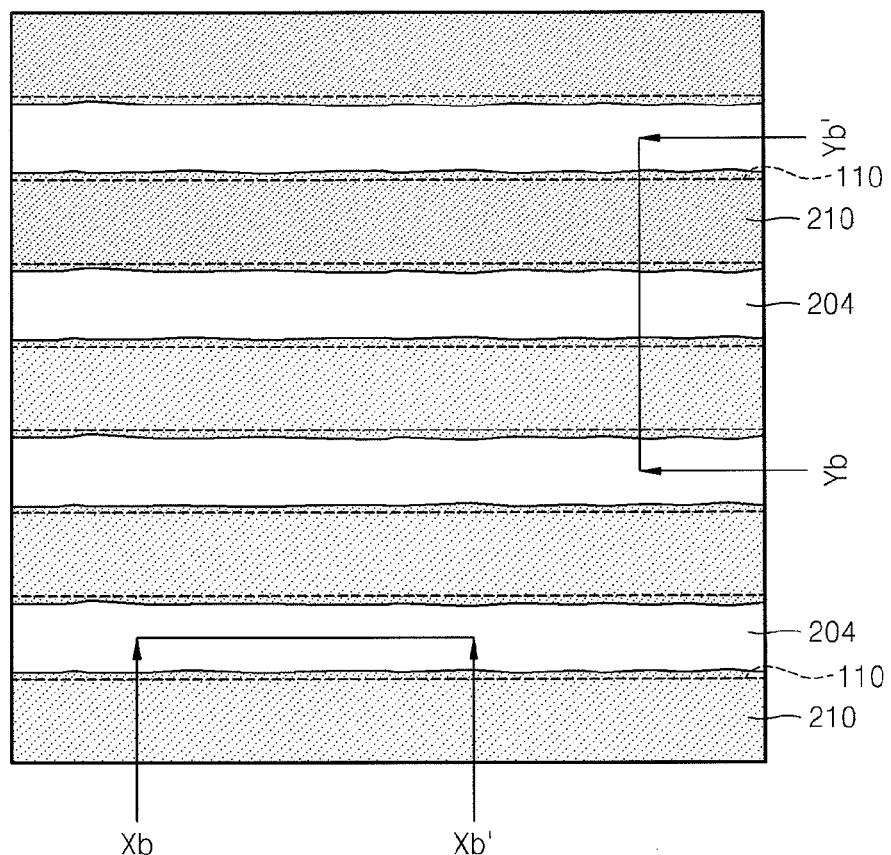
FIGS. 2A through 6B are plan views and cross-sectional views illustrating a method of manufacturing a semiconductor device according to an embodiment of the inventive concept.
Figure 2B:
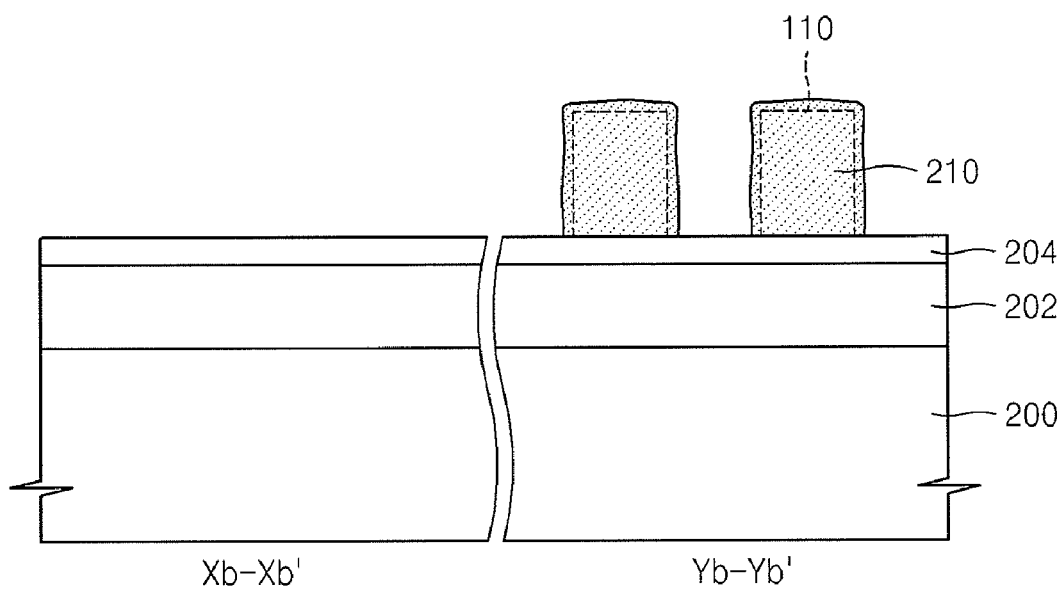

Referring to FIGS. 2A and 2B, a hard mask layer 202 and an anti-reflective layer 204 are sequentially formed on a substrate 200. The hard mask layer 202 may be formed of, for example, SiON; and the anti-reflective layer 204 may be formed of, for example, an organic or inorganic bottom anti-reflective coating (BARC) layer.

A first resist layer (not shown) is formed on the anti-reflective layer 204. Exposing and developing processes are performed on the first resist layer according to a layout of the first lines 10 of FIG. 1 to form first resist patterns 210.

The first resist patterns 210 are formed to have the same layout (marked with dotted lines in FIGS. 2A and 2B) as that of the first resist patterns 110 of FIG. 1. The first resist patterns 210 may, however, have undesired profiles, as shown with the solid lines of FIGS. 2A and 2B due to undesired resist residues, such as scum or foot, occurring around the first resist patterns 210, and line width roughness (LWR).

The first resist patterns 210 may be formed from a 248 nm KrF excimer laser resist composition, a 193 nm ArF excimer laser resist composition, or a 13.5 nm extreme ultraviolet (EUV) resist composition. In particular, the first resist patterns 210 may be formed from a resist composition including polymer having a lactone group or an ester group.

Figure 3A:
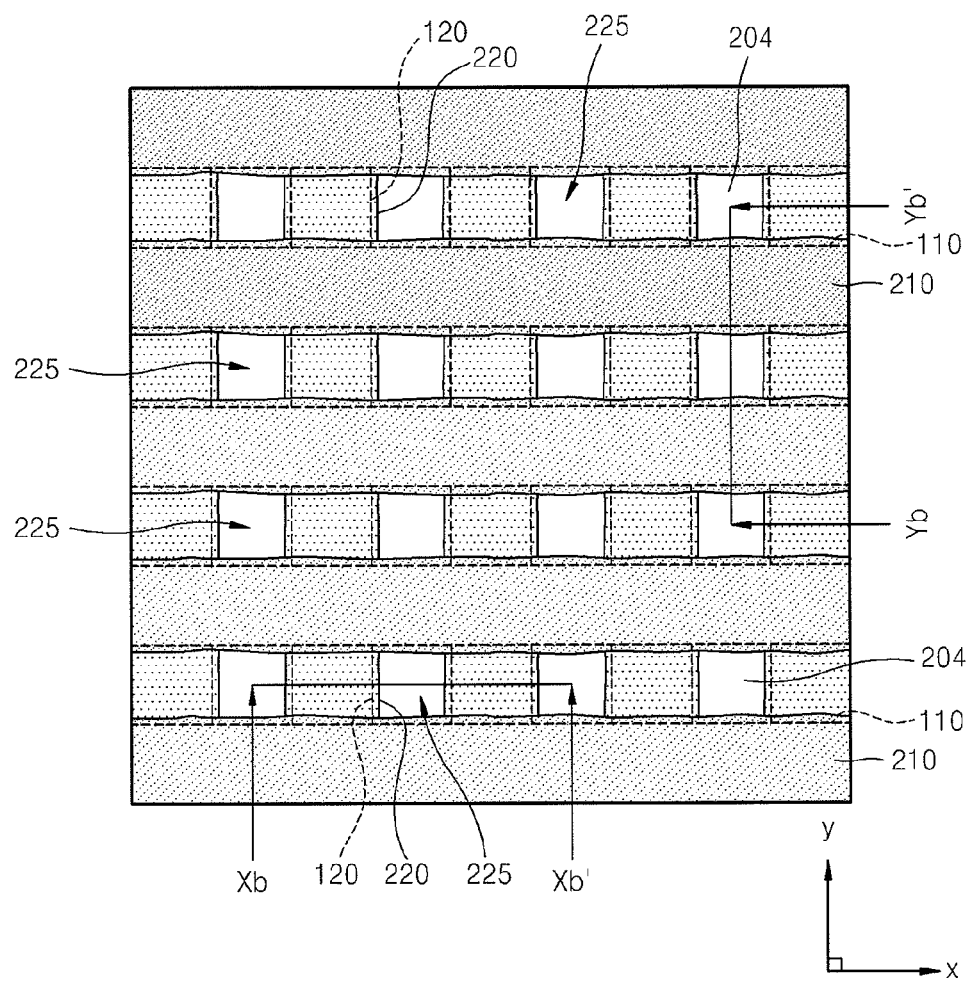
Figure 3B:
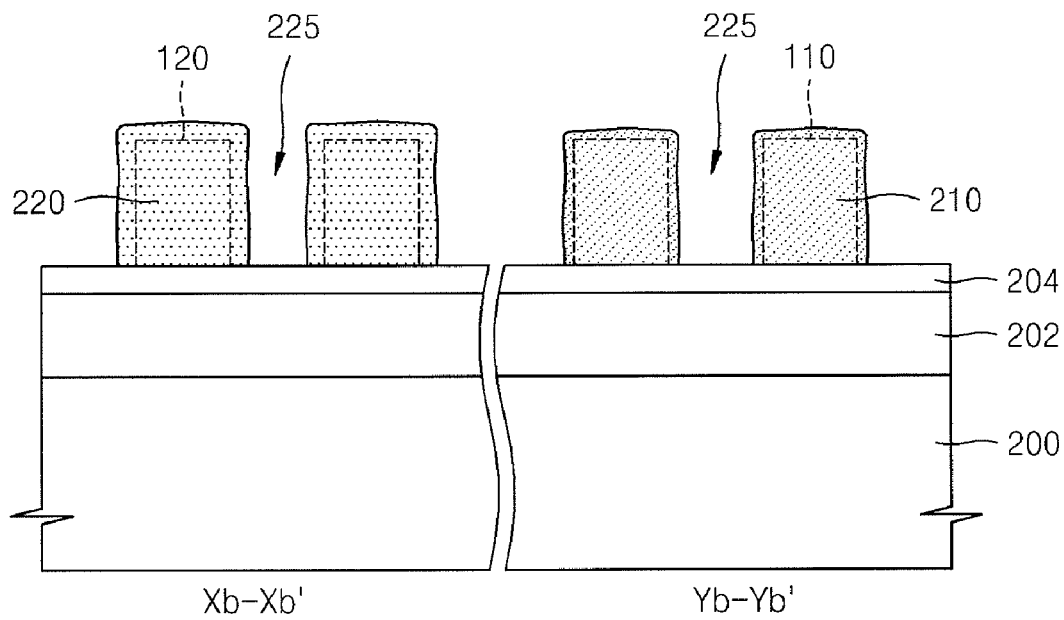

Referring to FIGS. 3A and 3B, a second resist layer (not shown) is formed on the substrate 200 on which the first resist patterns 210 have been formed. Exposing and developing processes are performed on the second resist layer according to the layout of the second lines 20 of FIG. 1 to form the second resist patterns 220.

The second resist patterns 220 are formed to have the same layout (marked with dotted lines in FIGS. 3A and 3B) as that of the second resist patterns 120 of FIG. 1. However, when the second resist layer is being exposed to light to form the second resist patterns 220, the second resist patterns 220 may easily receive a halation influence due to the first resist patterns 210. Thus, undesired resist residues such as scum or foot may be produced around the second resist patterns 220, and profiles of the second resist patterns 220 may be deteriorated. As a result, as shown in FIGS. 3A and 3B, the second resist patterns 220 do not have fine profiles like the profiles of the second resist patterns 120 marked with the dotted lines but have LWR and poor profiles, as marked with solid lines.

A plurality of hole areas 225 are defined by the first and second resist patterns 210 and 220, and the anti-reflective layer 204 is exposed through the plurality of hole areas 225.

The second resist patterns 220 may be formed from a 248 nm KrF excimer laser resist composition, a 193 nm ArF excimer laser resist composition, or a 13.5 EUV resist composition. In particular, the second resist patterns 220 may be formed from a resist composition including polymer having a lactone group or an ester group. The second resist patterns 220 may be formed of the same material as that of which the first resist patterns 210 are formed.

Figure 4A:
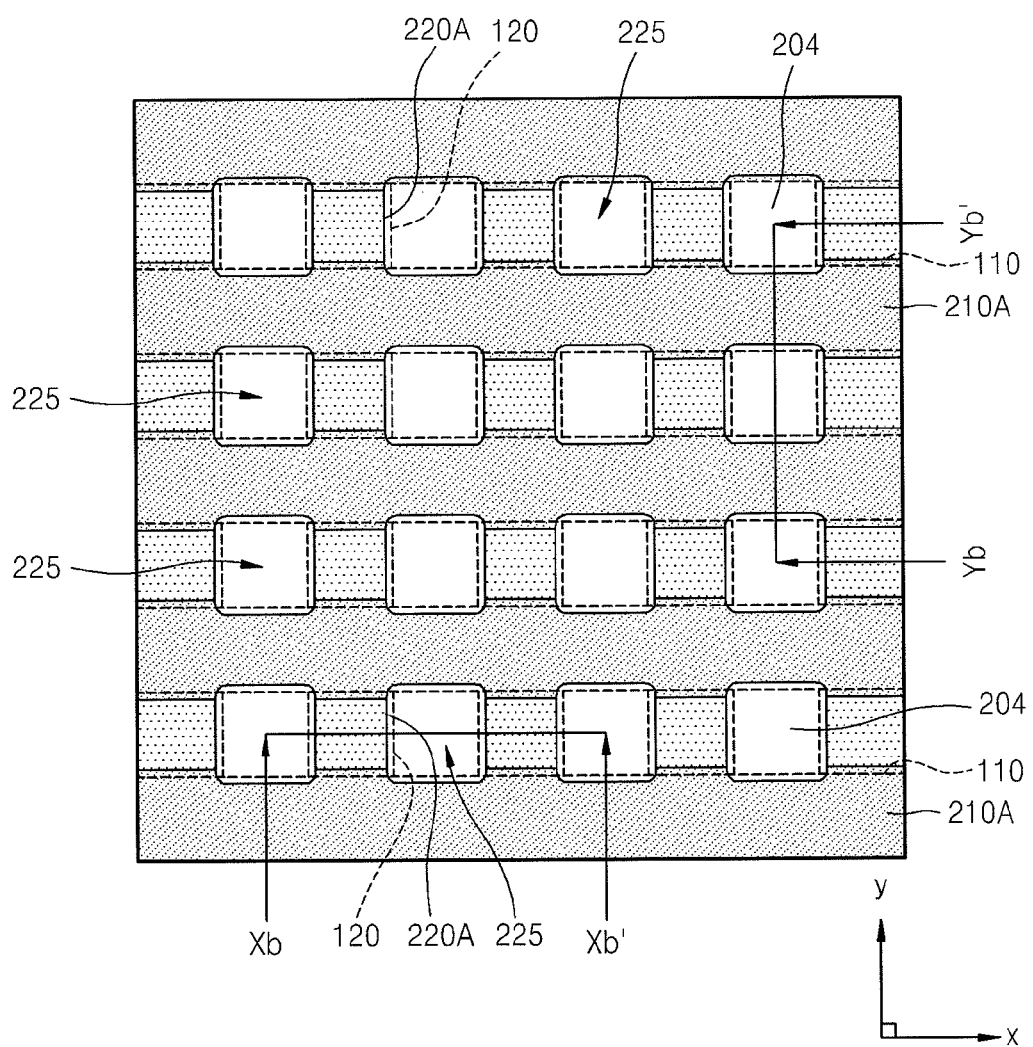
Figure 4B:
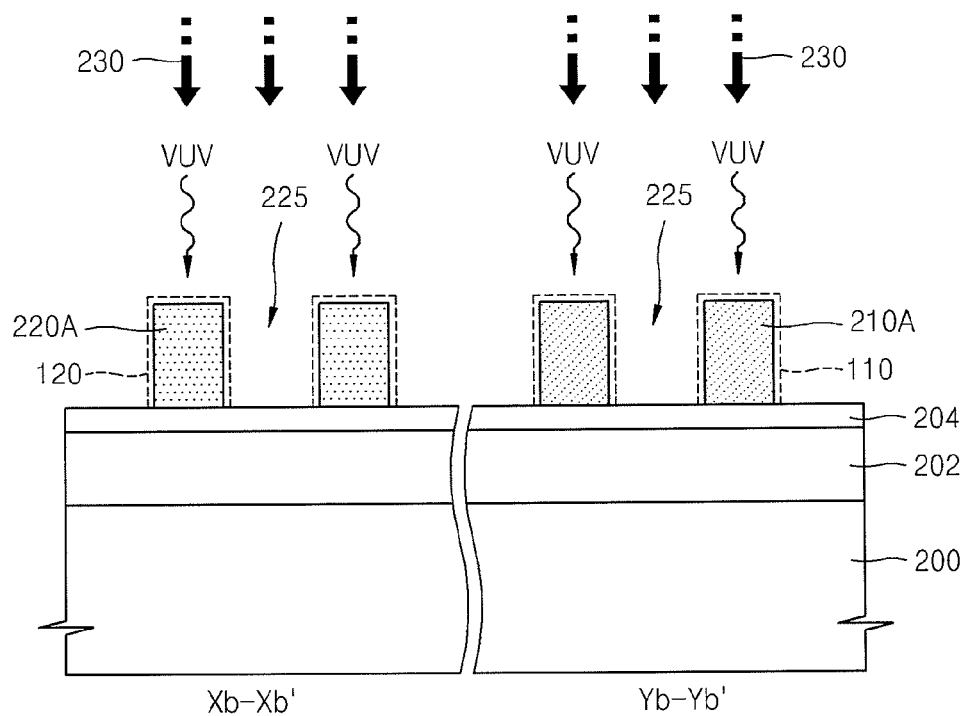

Referring to FIGS. 4A and 4B, the first and second resist patterns 210 and 220 are exposed to a first gas plasma 230 to trim the first and second resist patterns 210 and 220. As a result, the profiles of the first and second resist patterns 210 and 220 are changed. Trimmed first resist patterns 210A and trimmed second resist patterns 220A, which have narrower widths than the first and second resist patterns 110 and 210 having desired profiles, are obtained.

The first gas plasma 230 may be formed of plasma that is obtained from a mixture of at least one first gas and at least one second gas, wherein the at least one first gas is selected from the group consisting of $H_2$, $N_2$, $NH_3$, $O_2$, CO, $CO_2$, and carbonyl sulfide (COS), and the at least one second gas is selected from the group consisting of He, Ar, Kr, and Xe. For example, the first gas plasma 230 may be formed of plasma that is obtained from a mixture of $H_2$ and Ar gases.

Capacitively-coupled-plasma-(CCP-) type plasma equipment may be used to expose the first and second resist patterns 210 and 220 to the first gas plasma 230.

When the first and second resist patterns 210 and 220 are being exposed to the first gas plasma 230, the first and second resist patterns 210 and 220 are etched from their exposed surfaces to predetermined thicknesses by ion bombardments and radical reactions occurring on surfaces of the first and second resist patterns 210 and 220, thereby obtaining the trimmed first and second resist patterns 210A and 220A.

When the first and second resist patterns 210 and 220 are being exposed to the first gas plasma 230 inside a reaction chamber of the CCP-type plasma equipment, vacuum ultraviolet (VUV) rays may be radiated on the first and second resist patterns 210 and 220, wherein the VUV rays have high energy and are emitted by photodissociation of the first gas plasma 230 (e.g., plasma VUV rays having a wavelength smaller than 150 nm).

Figure 8:
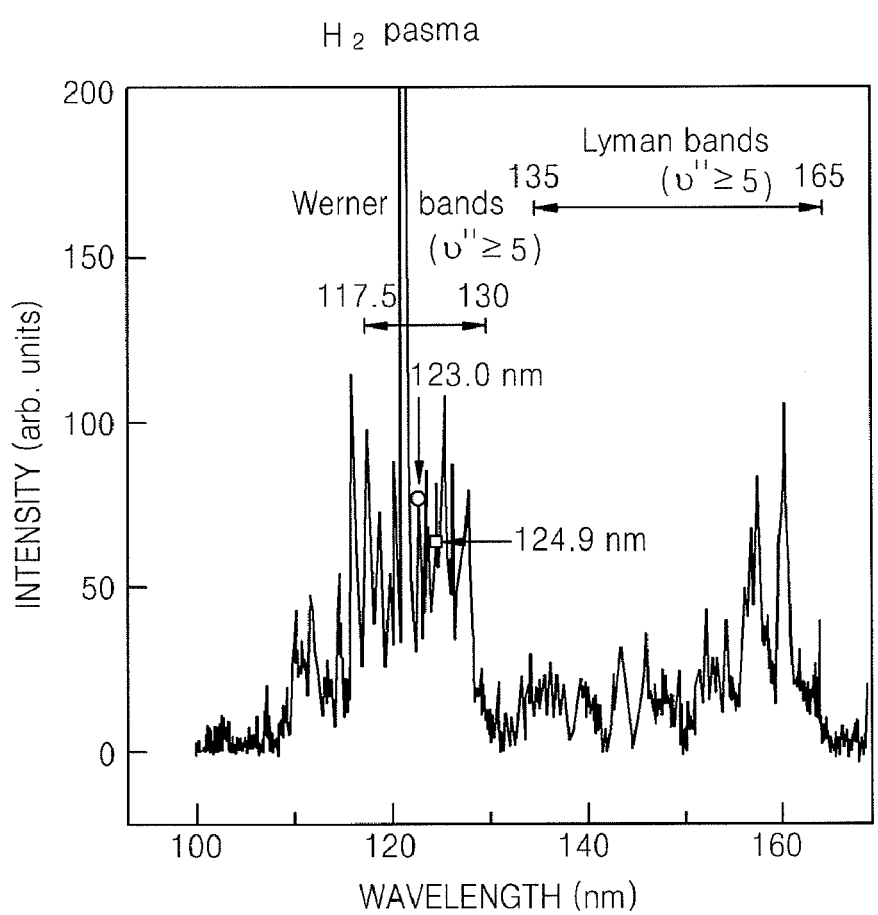
FIG. 8 is a graph illustrating a spectrum of plasma vacuum ultraviolet (VUV) rays emitted from $H_2$ plasma.

FIG. 8 is a graph illustrating a spectrum of plasma VUV rays emitted from $H_2$ plasma.

Figure 9:
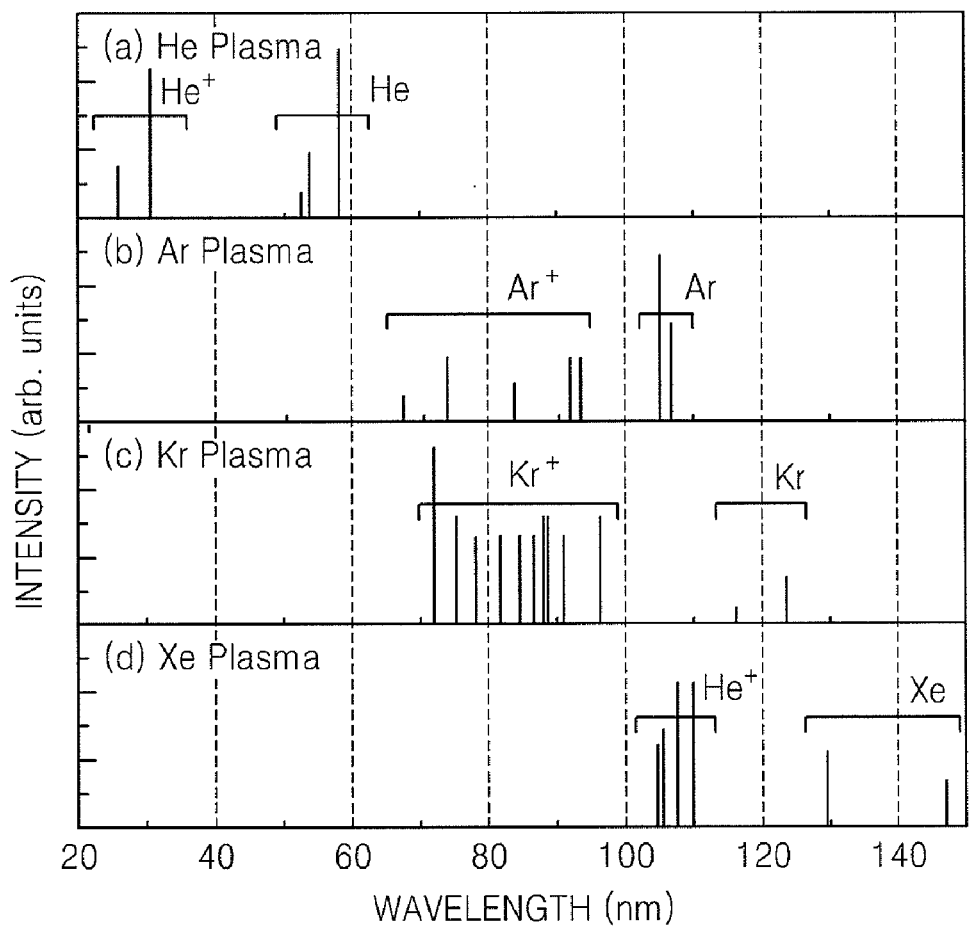
FIG. 9 is a graph illustrating spectrums of plasma VUV rays emitted from He plasma, Ar plasma, Kr plasma, and Xe plasma.

FIG. 9 is a graph illustrating spectrums of plasma VUV rays emitted from He plasma, Ar plasma, Kr plasma, and Xe plasma.

As shown in FIGS. 8 and 9, $H_2$ plasma and Ar plasma are applied to the first and second resist patterns 210 and 220 to cause the ion bombardments and the radical reactions on the surfaces of the first and second resist patterns 220, thereby removing resist residues such as scum or foot. As a result, surface roughnesses of the first and second resist patterns 210 and 220 are improved by plasma VUV rays having a wavelength smaller than 150 nm so that the first and second resist patterns 210 and 220 have smooth surfaces.

If the first and second resist patterns 210 and 220 are exposed to the first gas plasma 230 including gas-plasma-emitting plasma VUV rays, the plasma VUV rays may be radiated on the first and second resist patterns 210 and 220 to remove groups, such as a lactone group or an ester group, from a polymer structure constituting the first and second resist patterns 210 and 220. Thus, mobility of a polymer chain may be improved, and free volumes in the first and second resist patterns 210 and 220 may be increased. As a result, a glass-transition temperature, $T_g$, of the first and second resist patterns 210 and 220 may be lowered. For example, if the first and second resist patterns 210 and 220 include polymethyl methacrylate (PMMA)-based polymer, the glass transition temperature, $T_g$, of the first and second resist patterns 210 and 220 may be lowered from about 150° C. to about 100° C. Accordingly, the first and second resist patterns 210 and 220 are reflowed, thereby improving the surface roughnesses of the first and second resist patterns 210 and 220 and obtaining the trimmed first and second resist patterns 210A and 220A having the smooth surfaces. Also, C—C bonds may relatively increase on the surfaces of the first and second resist patterns 210A and 220A, and thus tolerances of the first and second resist patterns 210A and 220A to dry etching may be reinforced.

As described above, when the first and second resist patterns 210 and 220 are being exposed to the first gas plasma 230, the plasma VUV rays are radiated on the first and second resist patterns 210 and 220. Thus, the plasma VUV rays provide synergistic effects in a trimming process, caused by the ion bombardments and the radical reactions occurring on the first and second resist patterns 210 and 220. As a result, the trimmed first and second resist patterns 210A and 220A have fine profiles and high tolerances to dry etching.

The duration of time for exposing the first and second resist patterns 210 and 220 to the first gas plasma 230 is optimized to adjust reflow degrees and trimming degrees of the first and second resist patterns 210 and 220. As a result, critical dimensions (CDs) of the plurality of hole areas 225 defined by the first and second resist patterns 210 and 220 on the substrate 200 are increased, and the critical-dimension scattering of the plurality of hole areas 225 and the uniformity of each of the plurality of hole areas 225 are improved.

For example, if the trimmed first and second resist patterns 210A and 220A, each having a width of tens of nm levels, are to be formed, the substrate 200 on which the first and second resist patterns 210 and 220 have been formed may be loaded into the reaction chamber of the CCP-type plasma equipment. Radio frequency (RF) power of about 150 W may be applied into the reaction chamber, which is maintained at a pressure of about 800 mT and with a process-atmosphere temperature of about 20° C. $H_2$ gas flowing at about 450 standard cubic centimeters per minute (sccm) and Ar gas flowing at about 900 sccm may be supplied into the reaction chamber for about 20 seconds.

Figure 5A:
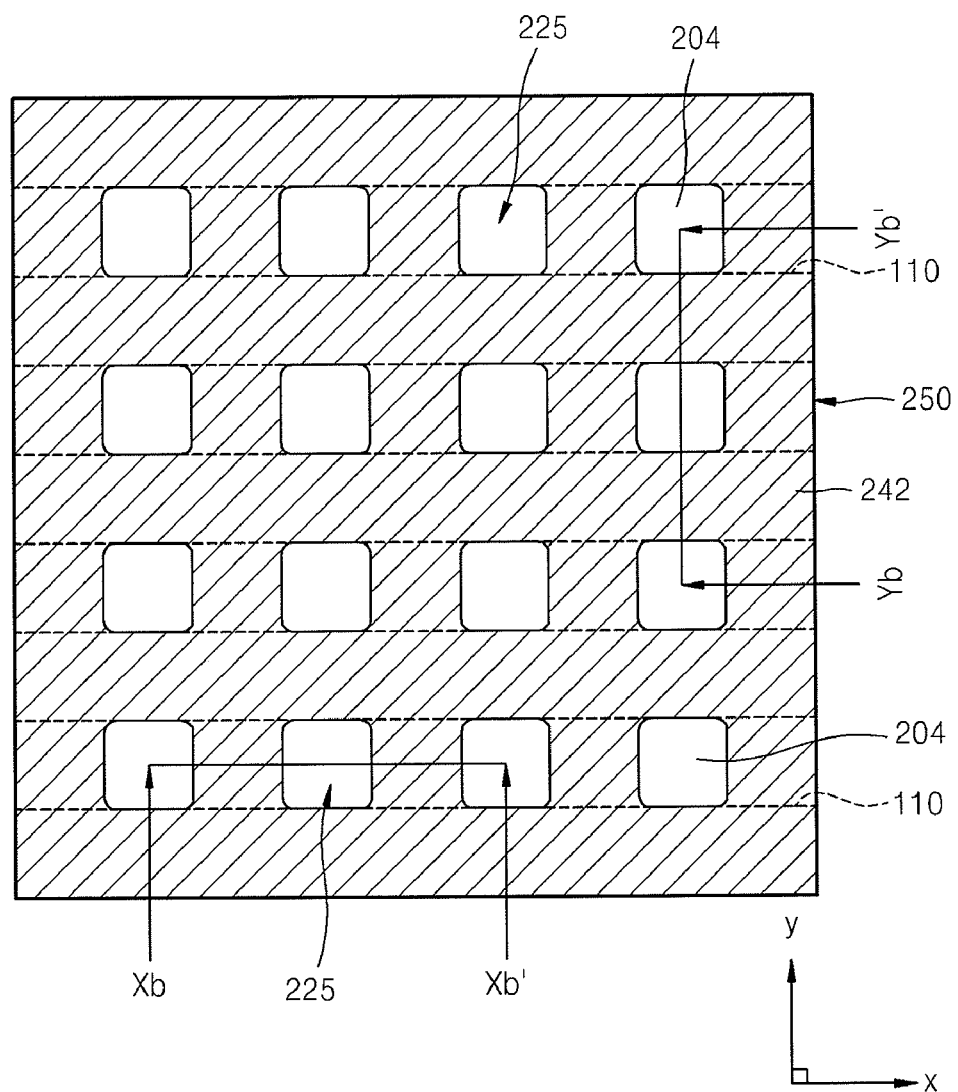
Figure 5B:
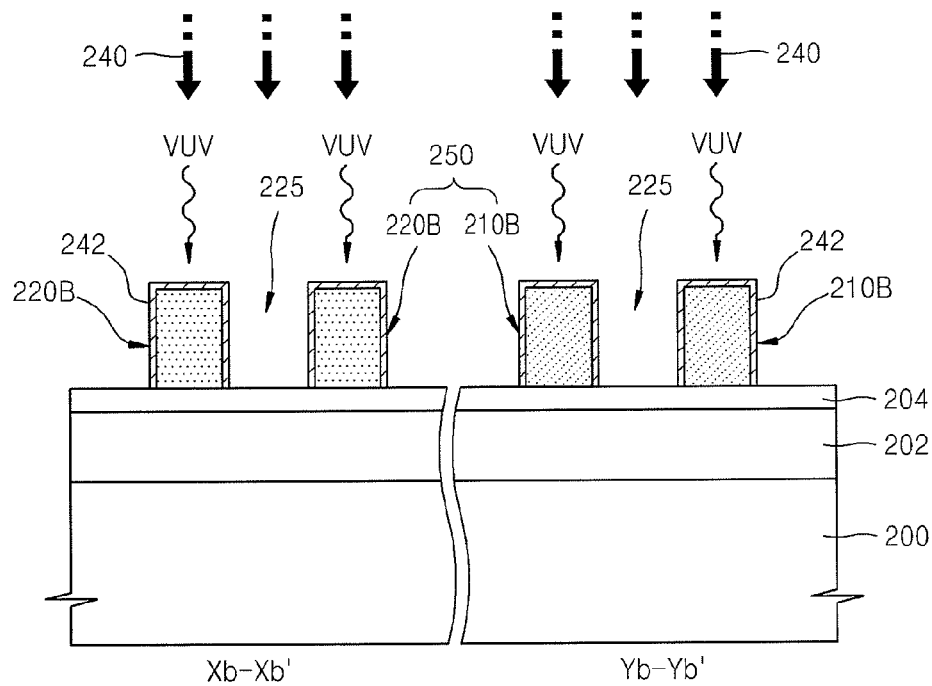

Referring to FIGS. 5A and 5B, the trimmed first and second resist patterns 210A and 220A are exposed to second gas plasma 240 to deposit densified layers 242 on exposed surfaces of the trimmed first and second resist patterns 210A and 220A.

Due to the formation of the densified layers 242 on the exposed surfaces of the trimmed first and second resist patterns 210A and 220A, processed resist patterns 250, which include first resist patterns 210B and second resist patterns 220B are obtained, wherein the first and second resist patterns 210B and 220B have wider widths than the trimmed first and second resist patterns 210A and 220A.

The time for exposing the trimmed first and second resist patterns 210A and 220A to the second gas plasma 240 is controlled to manage increases in widths of the trimmed first and second resist patterns 210A and 220, thereby forming the processed resist patterns 250 having desired dimensions by design.

The second gas plasma 240 may be formed of plasma that is obtained from a mixture of at least one first gas, at least one second gas, and a third gas, wherein the at least one first gas is selected from the group consisting of $H_2$, $N_2$, $NH_3$, $O_2$, CO, $CO_2$, and COS; the at least one second gas is selected from the group consisting of He, Ar, Kr, and Xe; and the third gas includes $C_xH_yF_z$ (where x, y, and z are each an integer between 1 and 10). The third gas may be formed of mixtures of $CF_4$, $CHF_3$, $CH_2F_2$, $C_4F_8$, $C_5F_8$, $C_6F_6$, and the like. For example, the second gas plasma 240 may be formed of plasma that is obtained from a mixture of $H_2$, Ar, and $CF_4$ gases.

The CCP-type plasma equipment may be used to expose the trimmed first and second resist patterns 210A and 220A to the second gas plasma 240.

When the trimmed first and second resist patterns 210A and 220A are being exposed to the second gas plasma 240, the third gas constituting the second gas plasma 240 (i.e., elements constituting $C_xH_yF_z$ gas plasma) is deposited on the surfaces of the trimmed first and second resist patterns 210A and 220A, thereby forming the densified layers 242. Scum is removed and profiles are improved by ion bombardments and radical reactions caused by $H_2$ plasma and Ar plasma and plasma VUV rays having a wavelength smaller than 150 nm, wherein the plasma VUV rays are emitted in an atmosphere of the second gas plasma 240.

The time for which the trimmed first and second resist patterns 210A and 220A are exposed to the second gas plasma 240 is controlled to control thicknesses of the densified layers 242 formed on the exposed surfaces of the trimmed first and second resist patterns 210A and 220A. When the densified layers 242 are formed, the critical dimensions of the plurality of hole areas 225 may be adjusted to desired sizes while maintaining relatively uniform critical dimensions and shape uniformities of the plurality of hole areas 225, which are treated and obtained by the first gas plasma 230, as described with reference to FIGS. 4A and 4B.

For example, if resist patterns each having a width of tens of nm levels are to be formed, to form the processed resist patterns 250, the substrate 200 on which the trimmed first and second resist patterns 210A and 220A have been formed may be loaded into the reaction chamber of the CCP-type plasma equipment. RF power of about 300 W may be applied into the reaction chamber, which is maintained at a pressure of about 50 mT and with a process-atmosphere temperature of about 20° C. Each of an $H_2$ gas flowing at about 100 sccm, a $CF_4$ gas flowing at about 40 sccm, and an Ar gas flowing at about 800 sccm may be supplied into the reaction chamber for about 30 seconds.

Figure 6A:
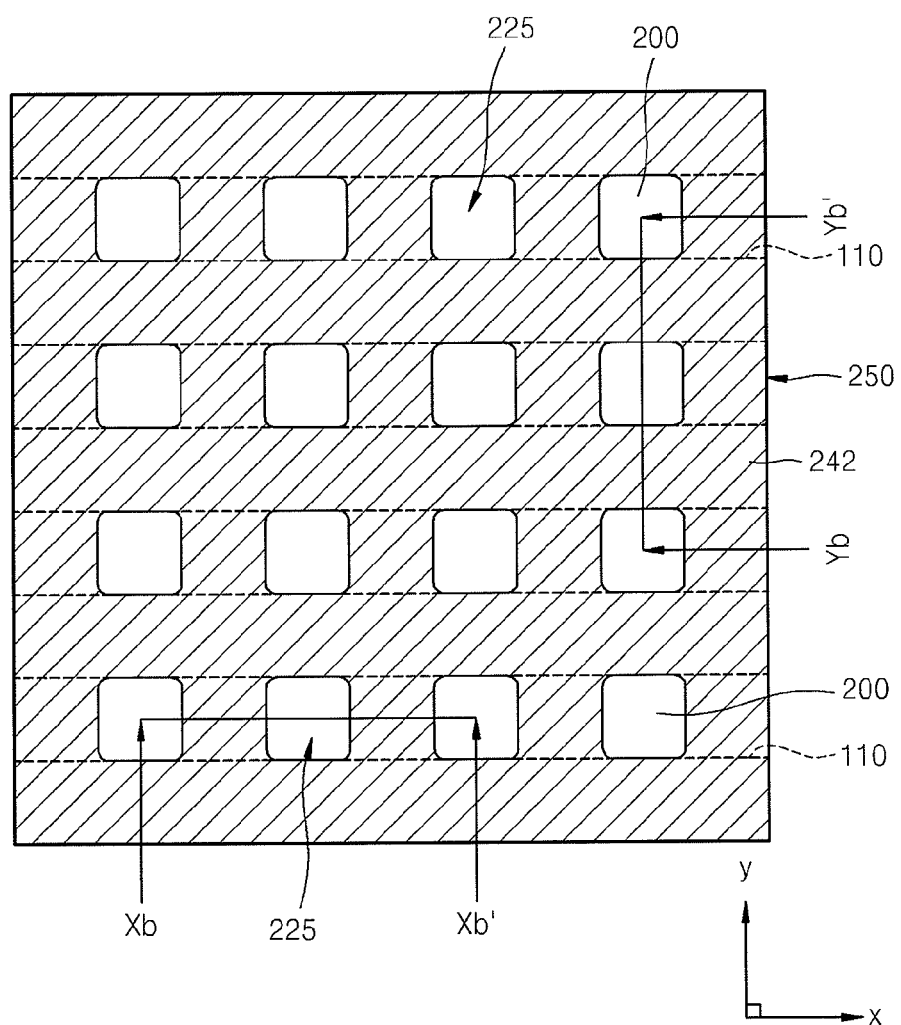
Figure 6B:
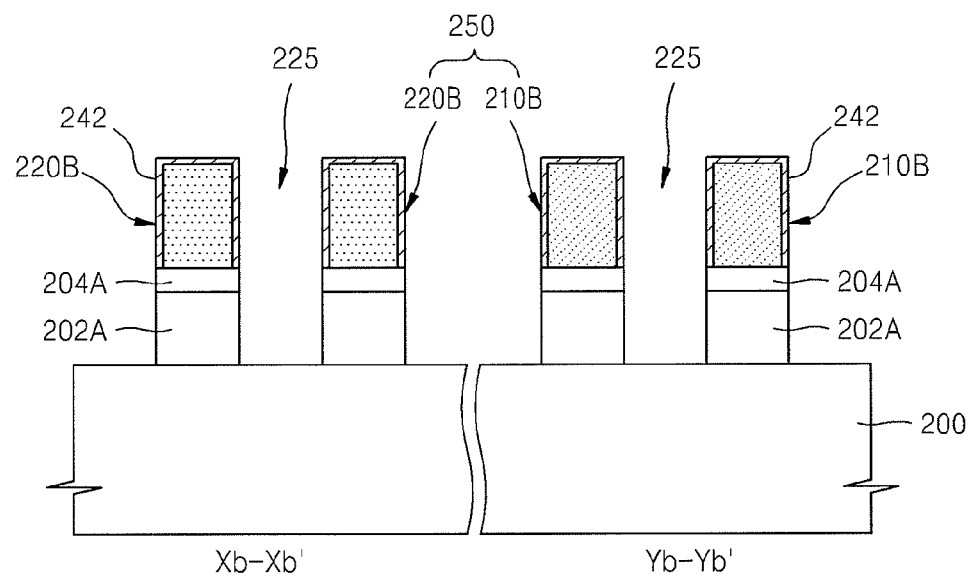

Referring to FIGS. 6A and 6B, the anti-reflective layer 204 and the hard mask layer 202 are sequentially etched using the processed resist patterns 250 as etching masks to form hard mask patterns 202A and anti-reflective patterns 204A.

In the above-described embodiment of the inventive concept, a process of forming the processed resist patterns 250 using a two-step treatment process has been described, wherein the two-step treatment process includes a step using the first gas plasma 230, as described with reference to FIGS. 4A and 4B, and a step using the second gas plasma 240, as described with reference to FIGS. 5A and 5B. A treatment process including a single step, however, may be performed using gas plasma including mixtures of gases having characteristic structures of the inventive concept to form processed resist patterns according to the inventive concept. This one-step process will be described later.

Figure 7A:
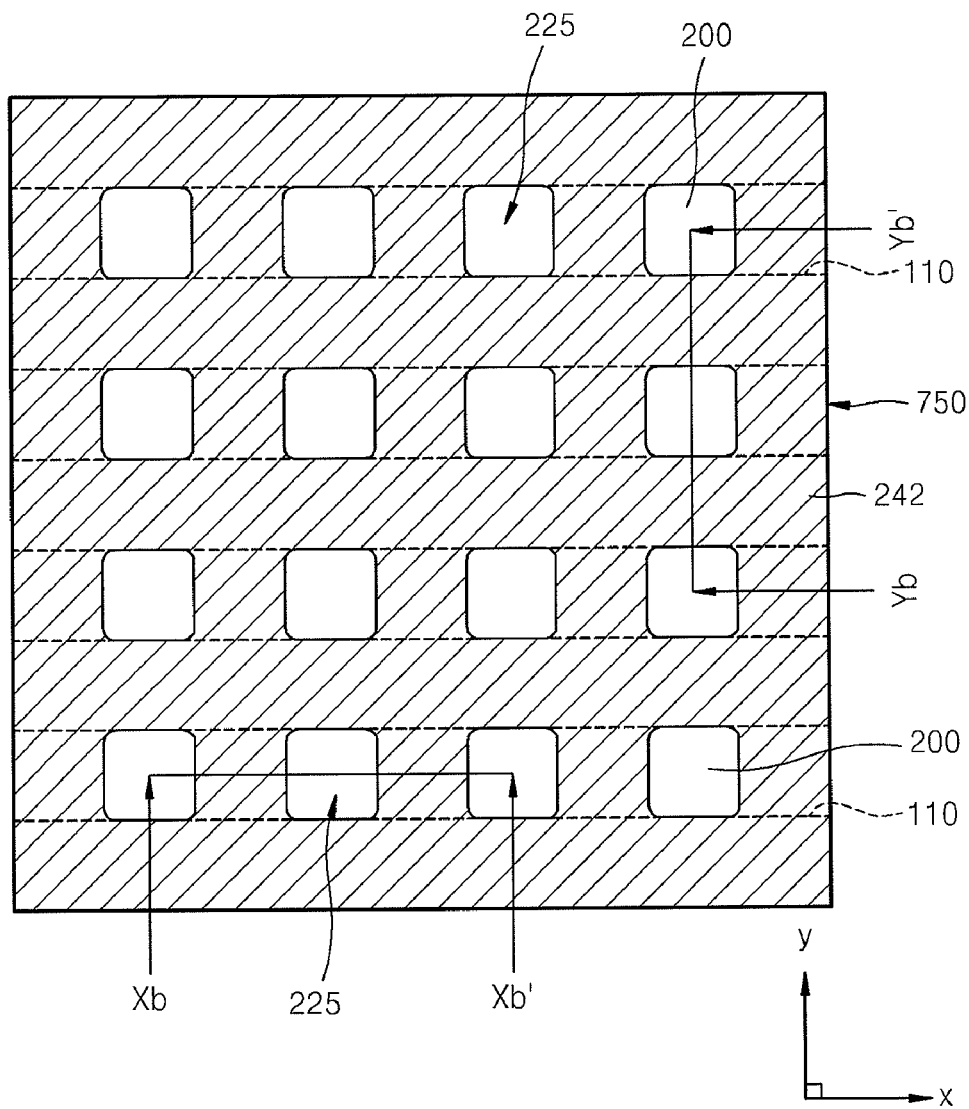
FIGS. 7A and 7B are a plan view and a cross-sectional view illustrating a method of manufacturing a semiconductor device according to another embodiment of the inventive concept.
Figure 7B:
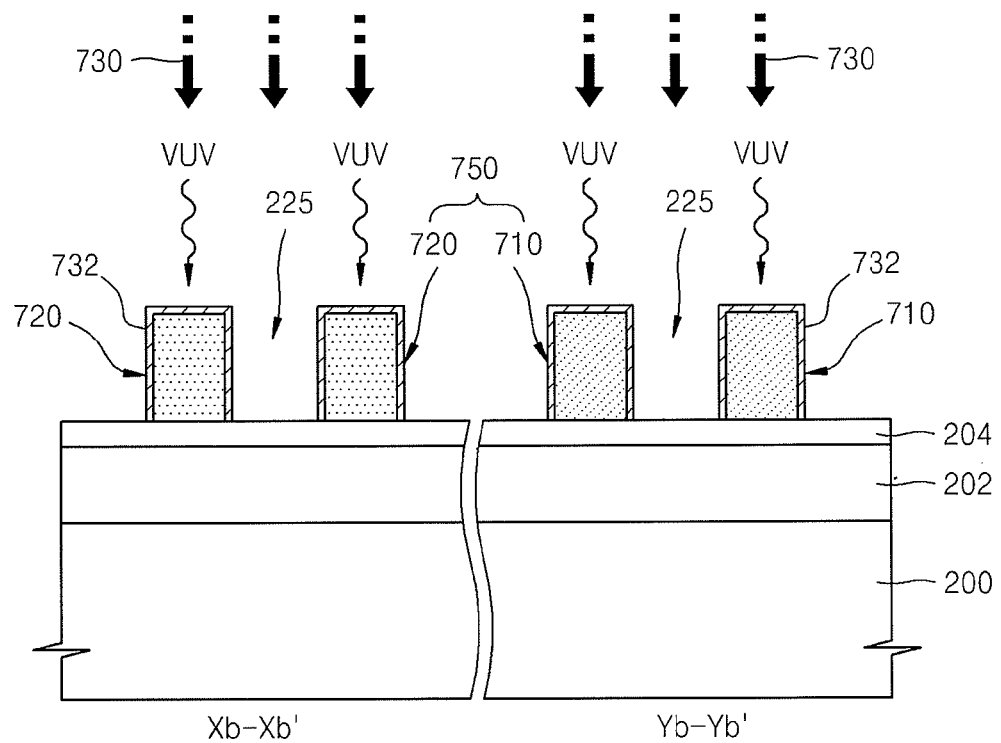

FIGS. 7A and 7B are a plan view and a cross-sectional view illustrating a method of manufacturing a semiconductor device according to another embodiment of the inventive concept. FIG. 7B illustrates a cross-sectional view taken along a line Xb-Xb' of FIG. 7A and a cross-sectional view taken along a line Yb-Yb' of FIG. 7A.

Reference numerals in FIGS. 7A and 7B that are the same as those in FIGS. 2A through 6B denote the same elements, and their detailed identities and characteristics are as described with reference to FIGS. 2A through 6B. Therefore, their detailed descriptions will be omitted for the current embodiment.

In the current embodiment, which will be described with reference to FIGS. 7A and 7B, processed resist patterns 750 are formed on a substrate 200 using a one-step process exposing first and second resist patterns 210 and 220 to third gas plasma 730 having a structure that is different from that of the first and second gas plasmas 230 and 240.

Referring to FIGS. 7A and 7B, the first and second resist patterns 210 and 220 are formed on the substrate 200 using the method described with reference to FIGS. 2A, 2B, 3A, and 3B and then exposed to the third gas plasma 730.

The third gas plasma 730 may be formed of plasma that is obtained from a mixture of at least one first gas, at least one second gas, and a third gas, wherein the at least one first gas is selected from the group consisting of $N_2$, $NH_3$, $O_2$, CO, $CO_2$, and COS; the at least one second gas is selected from the group consisting of He, Ar, Kr, and Xe; and the third gas includes $C_xH_yF_z$ (where each of x, y, and z is an integer between 1 and 10). For example, the third gas may be formed of a mixture of $CF_4$, $CHF_3$, $CH_2F_2$, $C_4F_8$, $C_5F_8$, $C_6F_6$, and the like. For example, the third gas plasma 730 may be formed of plasma that is obtained from a mixture of COS, Ar, and $CF_4$ gases. Alternatively, the third gas plasma 730 may be formed of plasma that is obtained from a mixture of COS, Ar, $CF_4$, and $O_2$ gases.

For example, to form resist patterns that each have a width of tens of nm (e.g., 10-99 nm), the processed resist patterns 750 are formed by loading the substrate 200 on which the first and second resist patterns 210 and 220 have been formed into a reaction chamber of CCP-type plasma equipment. RF power of about 300 W may be applied into the reaction chamber, which is maintained at a pressure of about 50 mT and with a process-atmosphere temperature of about 20° C. Each of a COS gas flowing at about 20 sccm, a $CF_4$ gas flowing at about 40 sccm, and an Ar gas flowing at about 800 sccm may be supplied into the reaction chamber for about 30 seconds. An $O_2$ gas flowing at about 5 sccm to 50 sccm may be supplied into the reaction chamber together when the COS, $CF_4$, and Ar gases are supplied into the reaction chamber.

Due to the exposure of the first and second resist patterns 210 and 220 to the third gas plasma 730, resist residues, such as scum or foot, are removed from exposed surfaces of the first and second resist patterns 210 and 220; and the first and second resist patterns 210 and 220 are trimmed by ion bombardments and radical reactions caused by the third gas plasma 730. Also, the first and second resist patterns 210 and 220 are reflowed by plasma VUV rays emitted from the third gas plasma 730. Thus, roughnesses of surfaces of the first and second resist patterns 210 and 220 are improved, thereby providing profiles having smooth surfaces. Also, critical-dimension scattering and shape uniformities of a plurality of hole areas 225 are improved on the substrate 200. Maintaining relatively uniform critical-dimension scattering and smooth profiles, as obtained above, COS plasma and $C_xH_yF_z$ plasmas constituting the third gas plasma 730 and selectively added elements constituting $O_2$ plasma are deposited on the surfaces of the first and second resist patterns 210 and 220, thereby obtaining processed resist patterns 750 including first resist patterns 710 and second resist patterns 720, wherein densified layers 732 are formed on surfaces of the first and second resist patterns 710 and 720.

The anti-reflective layer 204 and the hard mask layer 202 are sequentially etched using the processed resist patterns 750 as etching masks according to the method described with reference to FIGS. 6A and 6B to form hard mask patterns 202A and anti-reflective patterns 204A.

Figure 10A:
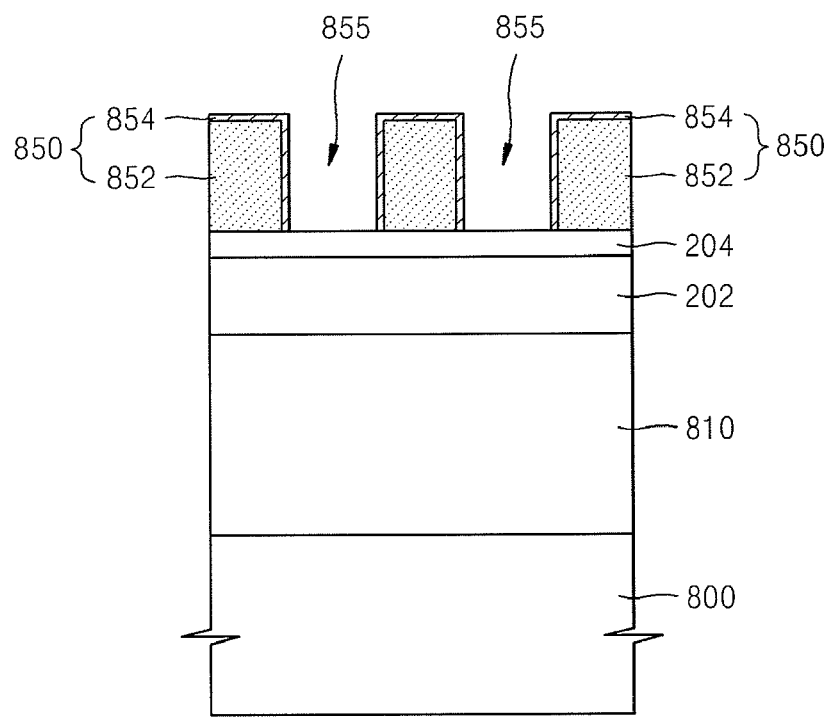
FIGS. 10A through 10C are cross-sectional views illustrating a method of manufacturing a semiconductor device according to another embodiment of the inventive concept.
Figure 10B:
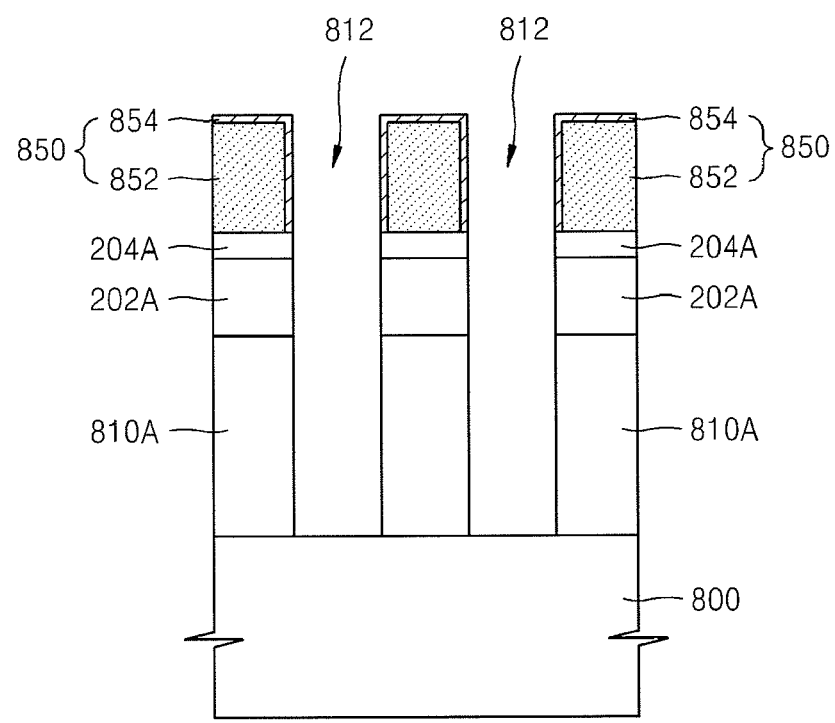
Figure 10C:
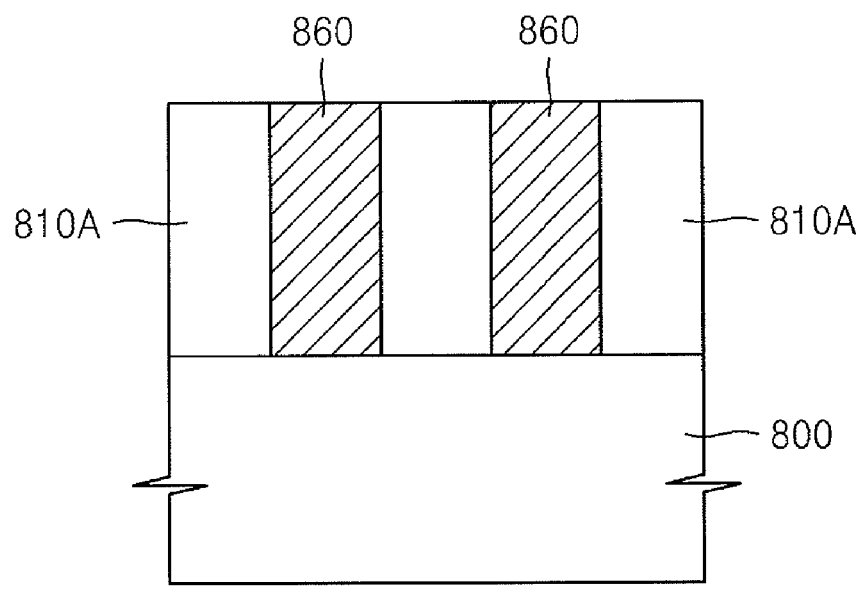

FIGS. 10A through 10C are cross-sectional views illustrating a method of manufacturing a semiconductor device according to another embodiment of the inventive concept.

The current embodiment exemplifies a process of forming contact plugs 860 of FIG. 10C on a substrate 800 using processed resist patterns 850 that are formed according to embodiments of the inventive concept.

Reference numerals in FIGS. 10A through 10C that are the same as those in FIGS. 2A through 6B, 7A, and 7B denote the same elements, and thus their detailed descriptions will be omitted herein.

Referring to FIG. 10A, an interlayer insulating layer 810 is formed on the substrate 800.

Although not shown in FIGS. 10A through 10C, a plurality of transistors including gate electrodes and source/drain areas may be formed on the substrate 800. The interlayer insulating layer 810 may be formed of an oxide layer, a nitride layer, or a combination of the oxide and nitride layers.

A hard mask layer 202 and an anti-reflective layer 204 are sequentially formed on the interlayer insulating layer 810.

The processed resist patterns 850 are formed above the interlayer insulating layer 810 using the same method as was used to form the processed resist patterns 250 (see FIGS. 6A and 6B), as described with reference to FIGS. 2A through 6B, or using the method of forming the processed resist patterns 750, as described with reference to FIGS. 7A and 7B.

The processed resist patterns 850 include trimmed resist patterns 852 and densified layers 854 formed on surfaces of the trimmed resist patterns 852.

A plurality of hole areas 855 are formed in the processed resist patterns 850 and expose the anti-reflective layer 204. The top view of the plurality of hole areas 855 may be as that of the plurality of hole areas 225 illustrated in FIGS. 5A and 6A.

Referring to FIG. 10B, the anti-reflective layer 204 and the hard mask layer 202 are sequentially etched using the processed resist patterns 850 as etching masks to form hard mask patterns 202A and anti-reflective patterns 204A. The interlayer insulating layer 810 is also etched using the processed resist patterns 850 as etching masks to form interlayer insulating layer patterns 810A in which a plurality of contact holes 812 are formed to expose the substrate 800.

The processed resist patterns 850 may be formed to have improved roughnesses, fine profiles, fine critical-dimension scattering, and high tolerances to dry etching using a two-step plasma treatment process or a one-step plasma treatment process, wherein the two-step plasma treatment process includes a treatment step using the first gas plasma 230, as described with reference to FIGS. 4A and 4B, and a treatment step using the second gas plasma 240, as described with reference to FIGS. 5A and 5B; and the one-step plasma treatment process includes a treatment step using the third gas plasma 730, as described with reference to FIGS. 7A and 7B. Therefore, if the interlayer insulating layer 810 is etched using the processed resist patterns 850 as the etching masks, the plurality of contact holes 812 may be obtained; critical-dimension scattering of the plurality of contact holes 812 may be improved; and the plurality of contact holes 812 may be formed to have uniform and fine shapes according to desired deign.

Referring to FIG. 10C, unnecessary layers remaining on the interlayer insulating layer patterns 810A are removed to expose upper surfaces of the interlayer insulating layer patterns 810A. The plurality of contact holes 812 are filled with a conductive material to form the plurality of contact plugs 860.

The plurality of contact plugs 860 may be used as various contacts for forming a semiconductor device. For example, the plurality of contact plugs 860 may be used as direct contacts, buried contacts, or contact pads for electrically connecting different types of conductive layers to one another.

Figure 11A:
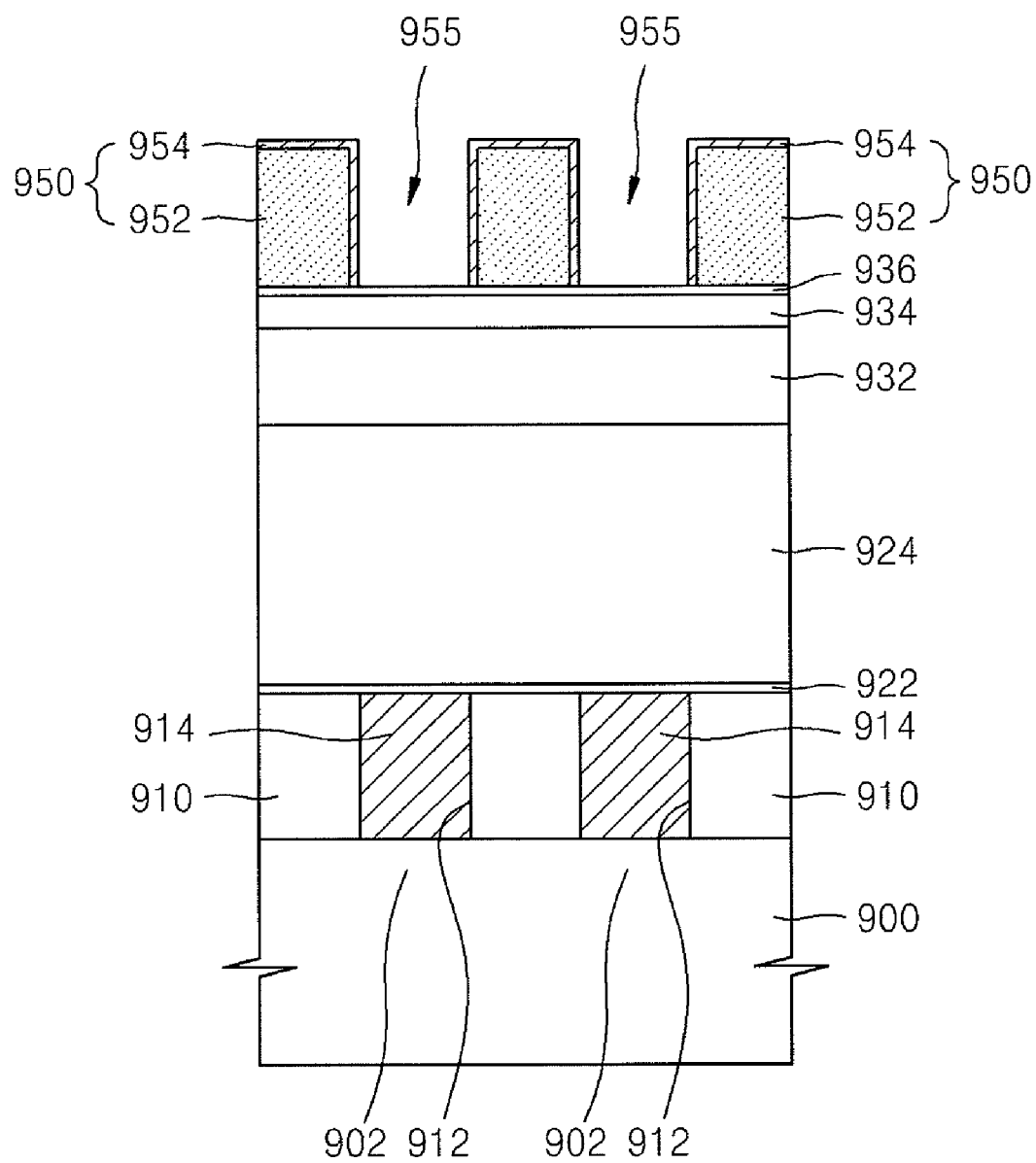
FIGS. 11A through 11C are cross-sectional views illustrating a method of manufacturing a semiconductor device according to another embodiment of the inventive concept.
Figure 11B:
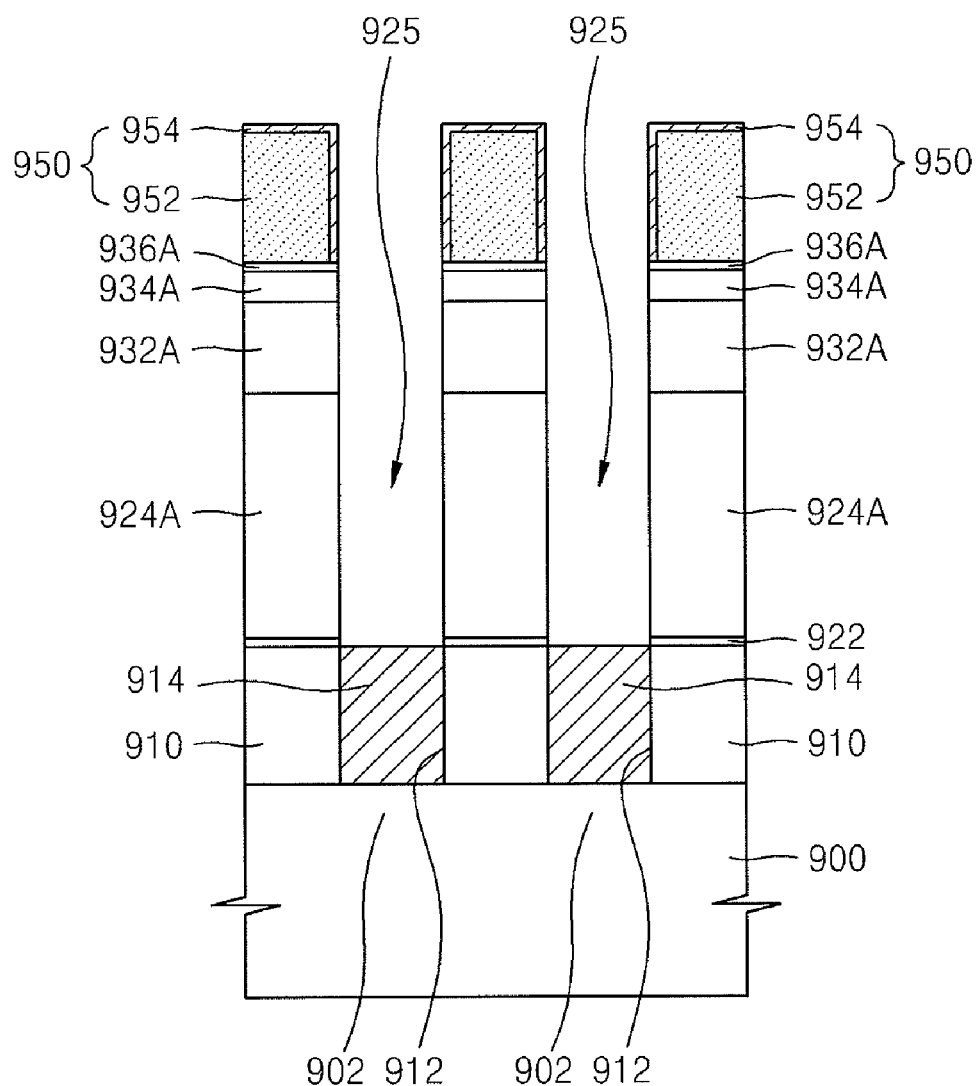
Figure 11C:
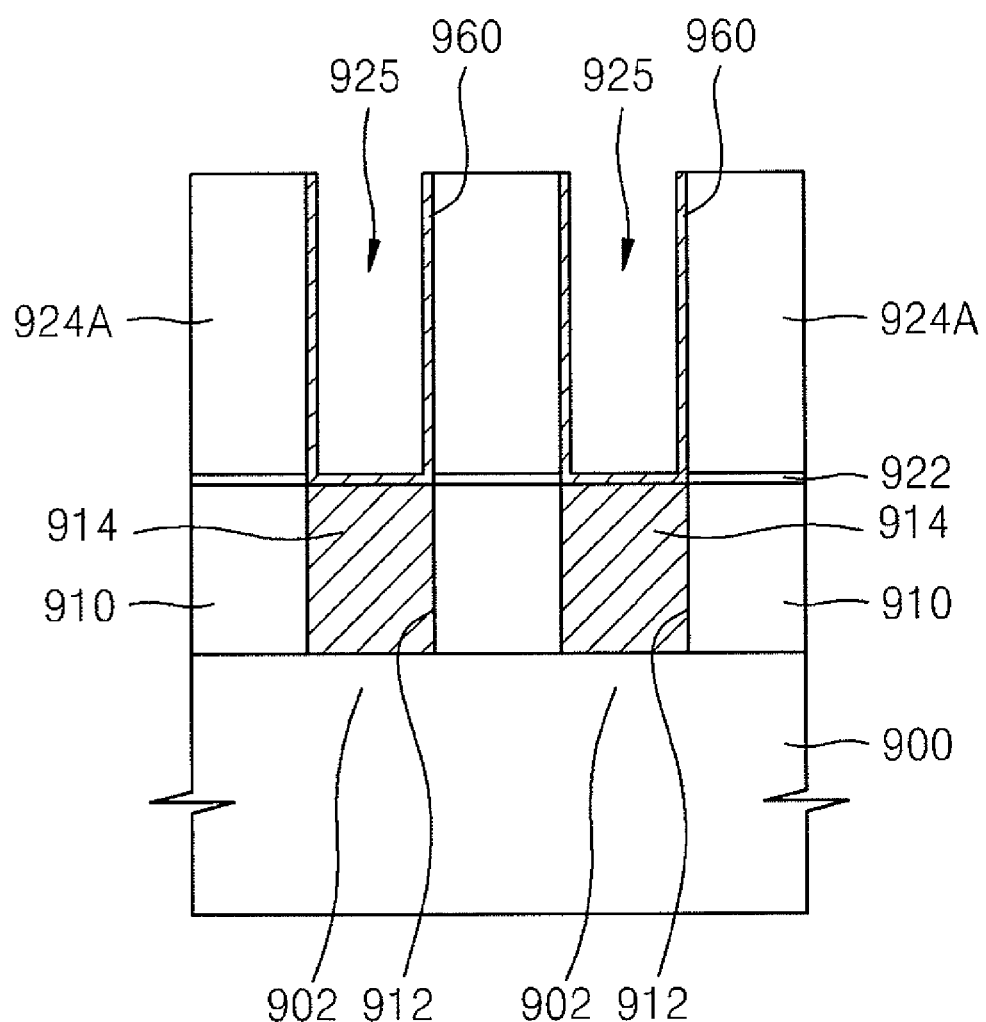

FIGS. 11A through 11C are cross-sectional views illustrating a method of manufacturing a semiconductor device according to another embodiment of the inventive concept.

The current embodiment exemplifies a process of forming one-cylinder-storage (OCS) capacitor lower electrodes 960 of FIG. 11C on a substrate 900 using processed resist patterns 950 that are formed according to the inventive concept.

Reference numerals in FIGS. 11A through 11C that are the same as those in FIGS. 2A through 6B, 7A, and 7B denote the same elements, and thus their detailed descriptions will be omitted herein.

Referring to FIG. 11A, an interlayer insulating layer 910 is formed on the substrate 900.

Although not shown in FIGS. 11A through 11C, a plurality of transistors including gate electrodes and source/drain areas, and a plurality of bit lines, and the like may be formed on the substrate 900. The interlayer insulating layer 910 may be formed of an oxide layer, a nitride layer, or a combination of the oxide and nitride layers.

A portion of the interlayer insulating layer 910 is etched to form a plurality of storage node contact holes 912. The plurality of storage node contact holes 912 are filled with a conductive material (e.g., doped polysilicon) to form a plurality of conductive contact plugs 914 that are connected to an active area 902 of the substrate 900.

An etch stop layer 922 and a mold layer 924 are sequentially formed on the interlayer insulating layer 910 and on the plurality of conductive contact plugs 914. The etch stop layer 922 may be formed of a silicon nitride layer, and the mold layer 924 may be formed of a silicon oxide layer.

A first hard mask layer 932, a second hard mask layer 934, and an anti-reflective layer 936 are sequentially formed on the mold layer 924. The first hard mask layer 932 may be formed of an amorphous carbon layer (ACL). The second hard mask layer 934 may be formed of SiON. The anti-reflective layer 936 may be formed of an organic or inorganic BARC layer.

Processed resist patterns 950 are formed on the anti-reflective layer 936 using the same method as was used to form the processed resist patterns 250 (see FIGS. 6A and 6B), as described with reference to FIGS. 2A through 6B, or using the method of forming the processed resist patterns 750, as described with reference to FIGS. 7A and 7B.

The processed resist patterns 950 include trimmed resist patterns 920 and densified layers 954 formed on surfaces of the processed resist patterns 952.

A plurality of hole areas 955 are formed in the processed resist patterns 950 and may have shapes as illustrated in FIGS. 5A and 6B when seen on the top.

Referring to FIG. 11B, the anti-reflective layer 936 and the second hard mask 934 are sequentially etched using the processed resist patterns 950 as etching masks to form second hard mask patterns 934A and anti-reflective patterns 936A. The first hard mask layer 932 is etched using the processed resist patterns 950 as etching masks to form first hard mask patterns 932A. When the etching process for forming the first hard mask patterns 932A is being performed, portions of the processed resist patterns 950 may be consumed.

The mold layer 924 is etched using (a) remaining portions of the processed resist patterns 950, (b) the first hard mask patterns 932A, and (c) the second hard mask patterns 934A as etching masks to form mold patterns 924A in which a plurality of storage node holes 925 are formed to expose the conductive contact plugs 914. When the mold layer 924 is etched to form the plurality of storage node holes 925, the etch stop layer 922 may be used to stop the etching.

The processed resist patterns 950 may be formed to have improved roughnesses, fine profiles, fine critical-dimension scattering, and high tolerances to dry etching using a two-step plasma treatment process and a one-step plasma treatment process, wherein the two-step plasma treatment process includes the treatment step using the first gas plasma 230, as described with reference to FIGS. 4A and 4B, and the treatment step using the second gas plasma 240, as described with reference to FIGS. 5A and 5B; and the one-step plasma treatment process includes the treatment step using the third gas plasma 730, as described with reference to FIGS. 7A and 7B. Accordingly, the second hard mask layer 934, the first hard mask layer 932, and the mold patterns 924A are sequentially etched using the processed resist patterns 950 as etching masks. Thus, the plurality of storage node holes 925 may be obtained, and critical-dimension scattering of the plurality of storage node holes 925 may be improved. Also, the plurality of storage node holes 925 may be formed to have uniform, fine shapes according to desired design.

Referring to FIG. 11C, unnecessary layers remaining on the mold patterns 924A are removed to expose upper surfaces of the mold patterns 924A. A conductive layer is formed to cover the exposed surfaces of the conductive contact plugs 914 and the exposed surfaces of the mold patterns 924. The conductive layer is divided into plurality of nodes using a chemical mechanical polishing (CMP) process or an etch-back process to form the OCS capacitor lower electrodes 960 in the plurality of storage node holes 925.

Evaluation Example 1

Figure 12:
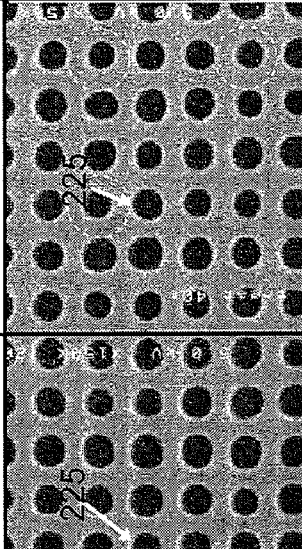
FIG. 12 is a graph illustrating results of evaluating changes in resist patterns with respect to times during which the resist patterns are treated using first gas plasma, in the manufacturing method described with reference to FIGS. 2A through 6B.

FIG. 12 is a graph illustrating results of evaluating changes in resist patterns with respect to times during which the resist patterns are treated using the first gas plasma 230 (see FIG. 4B) in the manufacturing method described with reference to FIGS. 2A through 6B.

In more detail, the first and second resist patterns 210 and 220 were formed on the substrate 200 (see FIGS. 3A and 3B) according to the manufacturing method described with reference to FIGS. 2A through 6B. The first and second resist patterns 210 and 220 were exposed to the first gas plasma 230 according to the method described with reference to FIGS. 4A and 4B. Changes in critical dimensions of the plurality of hole areas 225 were evaluated with respect to times during which the first and second resist patterns 210 and 220 were exposed to the first gas plasma 230.

For this evaluation, the first and second resist patterns 210 and 220 were formed using an ArF resist composition including PMMA-based polymer. Plasma obtained from a mixture of $H_2$ and Ar gases was used as the first gas plasma 230. The substrate 200 on which the first and second resist patterns 210 and 220 had been formed is loaded into the reaction chamber of the CCP-type plasma equipment. RF power of about 150 W was applied into the reaction chamber, which was maintained at a pressure of 800 mT and with a process-atmosphere temperature of about 20° C. $H_2$ gas flowing at about 450 sccm and Ar gas flowing at about 900 sccm are supplied into the reaction chamber.

Figure 13:
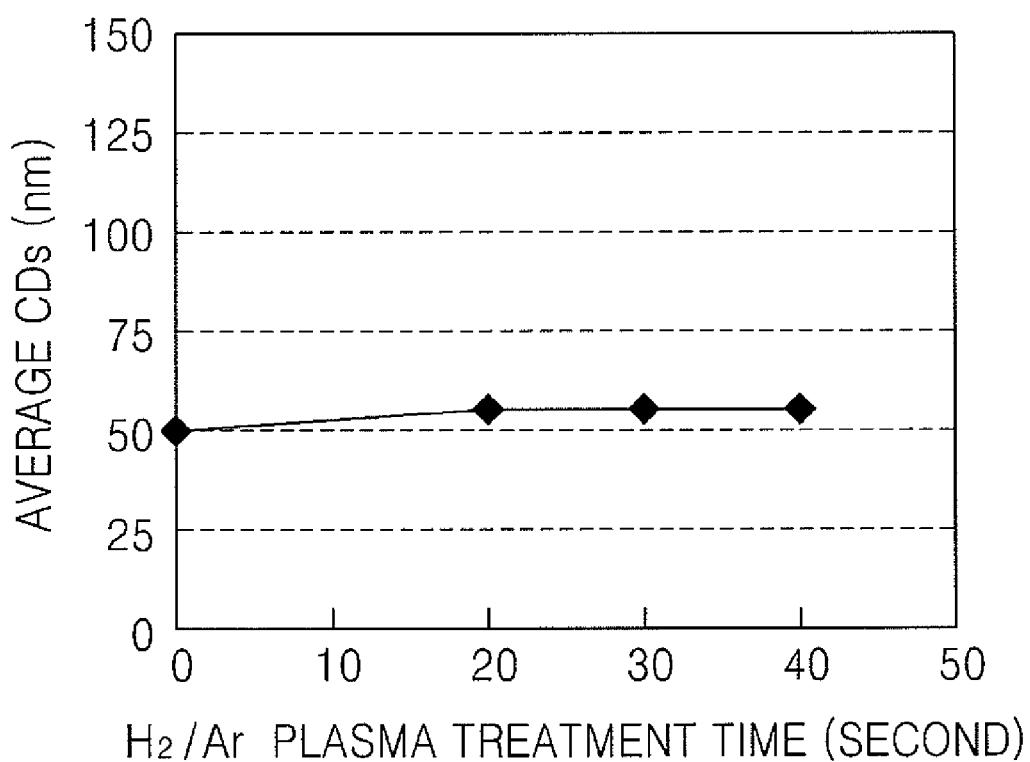
FIG. 13 is a graph illustrating changes in average critical dimensions of a plurality of hole areas with respect to the times during which the resist patterns are treated using the first gas plasma, in the results of FIG. 12.

FIG. 13 is a graph illustrating changes in average critical dimensions of the plurality of hole areas 225 with respect to the times during which the resist patterns were treated using the first gas plasma 230, in the results of FIG. 12.

According to the results of FIGS. 12 and 13, the average critical dimensions of the plurality of hole areas 225 increase with increases in the time during which the resist patterns were treated using the first gas plasma 230.

According to the results of FIGS. 12 and 13, trimming effects and surface roughness improvement effects of the first and second resist patterns 210 and 220 increase with increases in the time during which the first and second resist patterns 210 and 220 were treated using the first gas plasma 230.

Evaluation Example 2

FIG. 14 is a graph illustrating results of evaluating changes in resist patterns with respect to the time during which the resist patterns were treated using the second gas plasma 240 (see FIG. 5B) in the manufacturing method described with reference to FIGS. 2A through 6B.

In more detail, the first and second resist patterns 210 and 220 were formed on the substrate 200 (see FIGS. 3A and 3B) according to the manufacturing method described with reference to FIGS. 2A through 6B. As in Evaluation Example 1, the first and second resist patterns 210 and 220 were exposed to the first gas plasma 230 for 20 seconds to form the trimmed first and second resist patterns 210A and 220A (see FIGS. 4A and 4B). The trimmed first and second resist patterns 210A and 220A were then exposed to the second gas plasma 240 (see FIG. 5B). Changes in the critical dimensions of the plurality of hole areas 225 were evaluated with respect to the time during which the trimmed first and second resist patterns 210A and 220A were exposed.

For this evaluation, plasma obtained from a mixture of $H_2$, Ar, and $CF_4$ gases was used as the second gas plasma 240. The substrate 200 on which the trimmed first and second resist patterns 210A and 220A had been formed was loaded into the reaction chamber of the CCP-type plasma equipment. RF power of about 300 W was applied into the reaction chamber, which was maintained at a pressure of about 50 mT and with a process-atmosphere temperature of about 20° C. $H_2$ gas flowing at about 100 sccm, $CF_4$ gas flowing at about 40 sccm, and Ar gas flowing at about 800 sccm were supplied into the reaction chamber.

Figure 15:
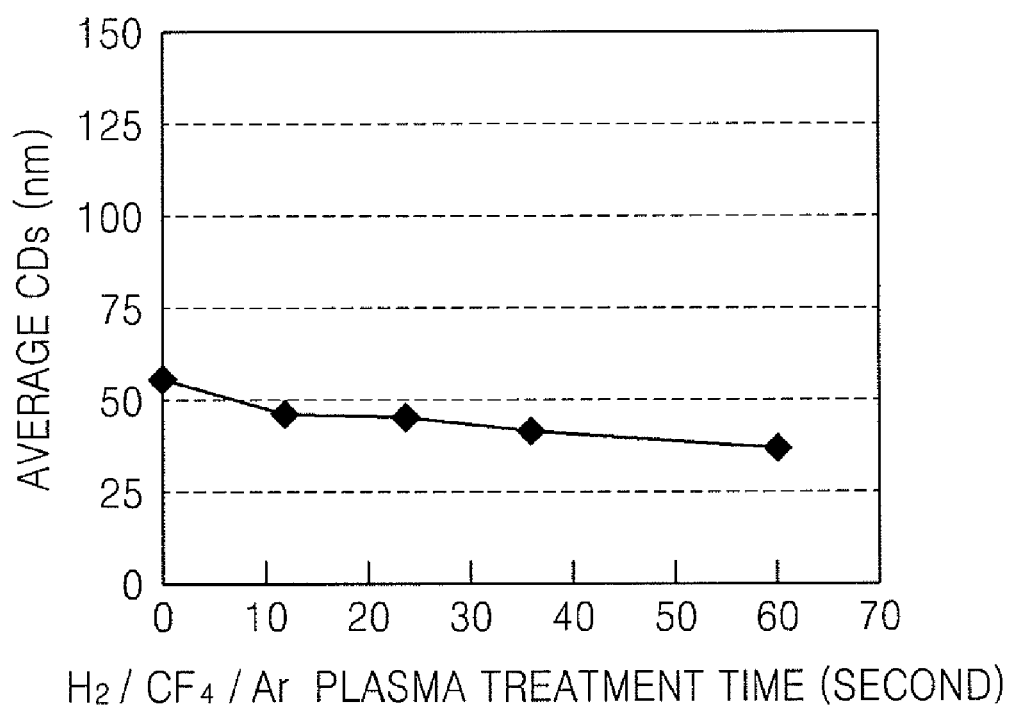
FIG. 15 is a graph illustrating changes in average critical dimensions of a plurality of hole areas with respect to times during which trimmed first and second resist patterns are treated using the second gas plasma, in the results of FIG. 14.

FIG. 15 is a graph illustrating changes in the average critical dimensions of the plurality of hole areas 225 with respect to the time during which the trimmed first and second resist patterns 210A and 220A were treated using the second gas plasma 240, in the results of FIG. 14.

According to the results of FIGS. 14 and 15, the average critical dimensions of the plurality of hole areas 225 gradually decrease with increases in the time during which the trimmed first and second resist patterns 210A and 220A were treated using the second gas plasma 240.

According to the results of FIGS. 14 and 15, the thicknesses of the densified layers 242 (see FIGS. 5A and 5B), which were formed on the surfaces of the trimmed first and second resist patterns 210A and 220A, increase with the increases in the time during which the trimmed first and second resist patterns 210A and 220A were treated using the second gas plasma 240.

Evaluation Example 3

Figure 16:
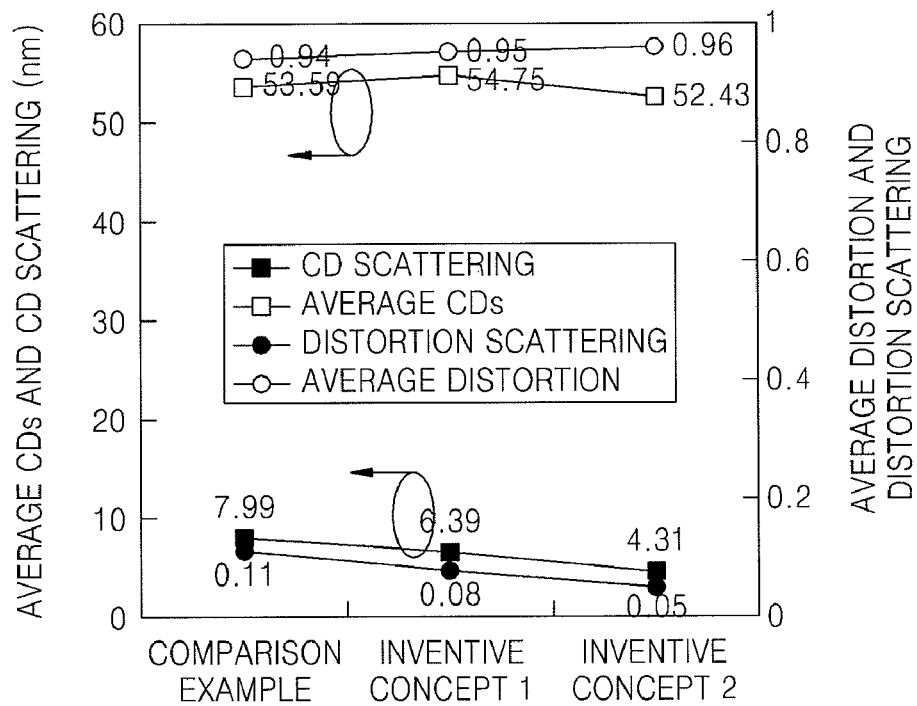
FIG. 16 is a graph illustrating results of evaluating critical-dimension scattering and shape uniformities of a plurality of hole areas when resist patterns are formed through a gas plasma treatment of a two-step treatment process according to the manufacturing method described with reference to FIGS. 2A through 6B.

FIG. 16 is a graph illustrating results of evaluating critical-dimension scattering and shape uniformities of a plurality of hole areas when resist patterns were formed through a two-step gas-plasma treatment process according to the manufacturing method described with reference to FIGS. 2A through 6B.

For this evaluation, as in Evaluation Example 1, the first and second resist patterns 210 and 220 (see FIGS. 3A and 3B) were treated for 20 seconds using the first gas plasma 230, which was obtained from a mixture of $H_2$ and Ar gases (Inventive Concept 1). As in Evaluation Example 2, the trimmed first and second resist patterns 210A and 220A (see FIGS. 4A and 4B) were treated for 30 seconds using the second gas plasma 240, which was obtained from a mixture of $H_2$, Ar, and $CF_4$ gases (Inventive Concept 2). In each of Inventive Concepts 1 and 2, critical-dimension scattering and shape distortion of the plurality of hole areas 225 were measured. As the shape distortion of the plurality of hole areas was approximately 1, the plurality of hole areas had approximately circular shapes and high shape uniformities.

Data about the first and second resist patterns 210 and 220, which were not treated using gas plasma, is illustrated as a comparison example in FIG. 16.

According to the results of FIG. 16, the processed resist patterns 250 (see FIG. 5B) were formed through plasma treatments using the first and second gas plasmas 230 and 240 according to a method of manufacturing a semiconductor device according to the inventive concept. Thus, the critical-dimension scattering and the shape uniformities of the plurality of hole areas 225 formed in the processed resist patterns 250 were improved.

Evaluation Example 4

Figure 17:
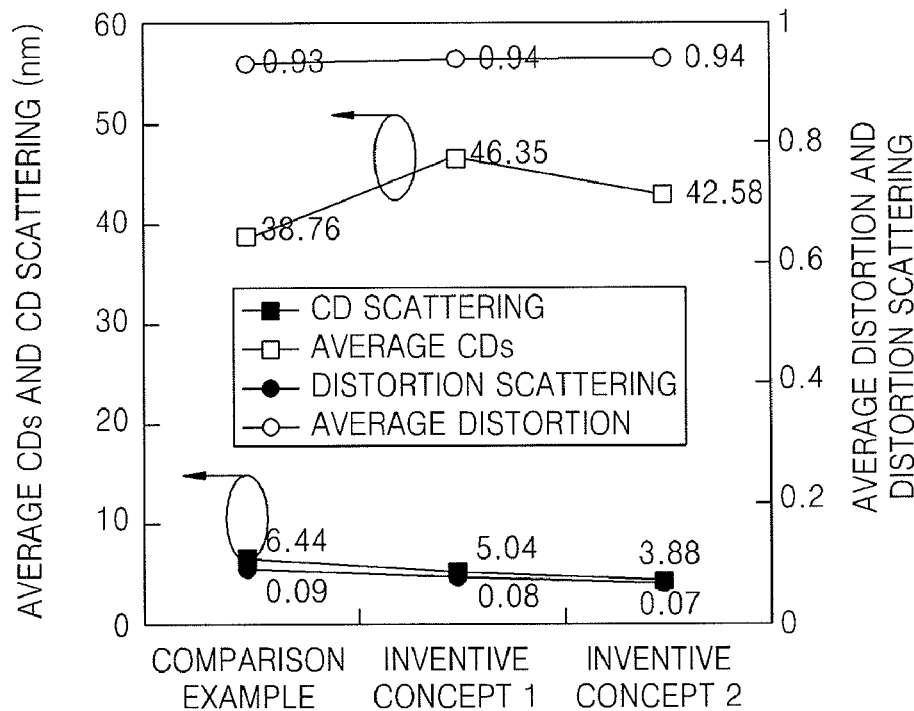
FIG. 17 is a graph illustrating results of evaluating critical-dimension scattering and shape uniformities of a plurality of hole areas formed in a hard mask layer after an anti-reflective layer and the hard mask layer are sequentially etched using resist patterns as etching masks according to a method of manufacturing a semiconductor device according to the inventive concept.

FIG. 17 is a graph illustrating results of evaluating critical-dimension scattering and shape uniformities of a plurality of holes formed in the hard mask layer 202 after the anti-reflective layer 204 and the hard mask layer 202 were sequentially etched using resist patterns, which had been used in Evaluation Example 3, as etching masks.

For this evaluation, the anti-reflective layer 204 and the hard mask layer 202 formed underneath the resist patterns were sequentially etched using the resist patterns used in Evaluation Example 3 as the etching mask according to a similar method to that described with reference to FIGS. 6A and 6B to form the hard mask patterns 202A and the anti-reflective patterns 204A (see FIG. 6B). The resist patterns used as the etching masks were removed by ashing, and then the critical-dimension scattering and shape uniformities of the plurality of holes formed in the hard mask patterns 202A were evaluated.

According to the results of FIG. 17, the processed resist patterns 250 (see FIG. 5B) were formed through plasma treatments using the first and second gas plasmas 230 and 240 according to a method of manufacturing a semiconductor device according to the inventive concept. The hard mask layer 202 was etched using the processed resist patterns 250 as etching masks to form the hard mask patterns 202A. The critical-dimension scattering and shape uniformities of the plurality of holes formed in the hard mask patterns 202A were improved.

Evaluation Example 5

FIG. 18 is a graph illustrating results of evaluating changes in resist patterns obtained by performing a gas-plasma treatment using various methods according to embodiments of the inventive concept.

In more detail, "pre-treatment" in FIG. 18 indicates that the first and second resist patterns 210 and 220 were formed on the substrate 200 and were not exposed to gas plasma as described with reference to FIGS. 3A and 3B.

"First Embodiment" in FIG. 18 indicates that the processed resist patterns 250 were formed on a substrate according to the manufacturing method described with reference to FIGS. 2A through 6B. To form the processed resist patterns 250, the first and second resist patterns 210 and 220 were exposed to the first gas plasma 230 for 20 seconds according to the method as in Evaluation Example 1 to form the trimmed first and second resist patterns 210A and 220A (see FIGS. 4A and 4B). The trimmed first and second resist patterns 210A and 220A were exposed to the second gas plasma 240 (see FIG. 5B) for 30 seconds according to the method as described in Evaluation Example 2.

"Second Embodiment" in FIG. 18 indicates that the processed resist patterns 750 were formed on a substrate according to the manufacturing method described with reference to FIGS. 7A and 7B. To form the processed resist patterns 750, the first and second resist patterns 210 and 220 formed according to the method described with reference to FIGS. 2A, 2B, 3A, and 3B were exposed to the third gas plasma 730 for 30 seconds. Conditions for exposing the first and second resist patterns 210 and 220 to the third gas plasma 730 were split into three cases.

"Second Embodiment (I)" indicates that RF power of about 300 W was applied into a reaction chamber of CCP-type plasma equipment that was maintained at a pressure of about 50 mT and with a process-atmosphere temperature of about 20° C.; and the first and second resist patterns 210 and 220 were exposed to gas plasma, which was obtained from a mixture of COS gas flowing at about 20 sccm, $CF_4$ gas flowing at about 40 sccm, and Ar gas flowing at about 800 sccm, for 30 seconds. Here, the direct current (DC) voltage of the CCP-type plasma equipment was 900V.

"Second Embodiment (II)" is the same as "Second Embodiment (I)" except that the DC voltage of the CCP-type plasma equipment was 300V.

"Second Embodiment (III)" is the same as "Second Embodiment (I)" except that the first and second resist patterns 210 and 220 were exposed to gas plasma obtained from a mixture of COS gas flowing at about 20 sccm, $CF_4$ gas flowing at about 40 sccm, Ar gas flowing at about 800 sccm, and $O_2$ gas flowing at about 5 sccm.

According to the results of FIG. 18, critical-dimension scattering and shape uniformities of a plurality of hole areas are further improved in processed resist patterns, which are formed through gas-plasma treatments according to the embodiments described with reference to FIGS. 2A through 6B and FIGS. 7A and 7B, compared with the patterns before the gas plasma treatments are performed.

While the inventive concept has been particularly shown and described with reference to exemplary embodiments thereof, it will be understood that various changes in form and details may be made therein without departing from the spirit and scope of the following claims. Moreover, other aspects, functions and advantages are also within the scope of the invention; and all embodiments of the invention need not necessarily achieve all of the advantages or possess all of the characteristics described above. Additionally, steps, elements and features discussed herein in connection with one embodiment can likewise be used in conjunction with other embodiments.

What is claimed is:

1. A method of manufacturing a semiconductor device, comprising:
    exposing and developing a resist layer formed on a substrate to form resist patterns having profiles;
    trimming the resist patterns using a first gas plasma to change the profiles of the resist patterns; and
    increasing widths of the trimmed resist patterns using a second gas plasma to form processed resist patterns,
    wherein the change of the profiles of the resist patterns and the formation of the processed resist patterns are simultaneously performed, and the first and second gas plasmas are obtained from an identical gas mixture.

2. The method of claim 1, wherein the resist patterns are exposed to plasma vacuum-ultraviolet rays having a wavelength smaller than 150 nm to change the profiles of the resist patterns and to form the processed resist patterns.

3. The method of claim 1, wherein each of the first and second gas plasmas is plasma that is obtained from a mixture of at least one first gas, at least one second gas, and a third gas, wherein the at least one first gas is selected from the group consisting of $N_2$, $NH_3$, $O_2$, CO, $CO_2$, and COS; the at least one second gas is selected from the group consisting of He, Ar, Kr, and Xe; and the third gas comprises $C_xH_yF_z$ (where each of x, y, and z is an integer between 1 and 10).

4. The method of claim 1, wherein each of the first and second gas plasmas is obtained from a mixture of COS, Ar, and $CF_4$ gases.

5. The method of claim 4, wherein the mixture further comprises $O_2$.

6. The method of claim 1, wherein:
    the resist patterns comprise first and second resist patterns that have different layouts; and
    the formation of the resist patterns comprises:
    forming a first resist layer on the substrate;
    exposing and developing the first resist layer to form the first resist patterns having a first layout;
    forming a second resist layer on the substrate and the first resist patterns; and
    exposing and developing the second resist layer to form the second resist patterns having a second layout on the substrate.

7. The method of claim 6, wherein:
    the first resist patterns comprise a plurality of first patterns that are formed along a plurality of first lines extending in a first direction on the substrate;
    the second resist patterns comprise a plurality of second patterns that are formed along a plurality of second lines intersecting with the plurality of first lines on the substrate; and
    the plurality of first patterns and the plurality of second patterns define a plurality of hole areas on the substrate.

8. A method of manufacturing a semiconductor device, comprising:
    forming a plurality of first resist patterns on a substrate along a plurality of first lines;
    forming a plurality of second resist patterns on the substrate along a plurality of second lines intersecting with the plurality of first lines;
    exposing the first and second resist patterns to a first gas plasma and to first plasma vacuum-ultraviolet rays that trim the first and second resist patterns; and
    exposing the trimmed first and second resist patterns to a second gas plasma and to second plasma vacuum-ultraviolet rays that form densified first resist patterns and densified second resist patterns,
    wherein the trimming of the first and second resist patterns and the formation of the densified first and second resist patterns are simultaneously performed; and each of the first and second gas plasmas is obtained from a mixture of COS, Ar, $CF_4$, and $O_2$ gases.

9. A method of manufacturing a semiconductor device, comprising:
    forming a first layer on a substrate;
    forming a plurality of first resist patterns on the first layer along a plurality of first lines;
    forming a plurality of second resist patterns on the first layer along a plurality of second lines intersecting with the plurality of first lines to define a plurality of hole areas by the plurality of first resist patterns and the plurality of second resist patterns, wherein the plurality of hole areas have profiles and expose the first layer;
    exposing the first and second resist patterns to a first gas plasma and to first plasma vacuum-ultraviolet rays that change the profiles of the plurality of hole areas;
    exposing the first and second resist patterns to a second gas plasma and to second plasma vacuum-ultraviolet rays that form densified first resist patterns and densified second resist patterns and that reduce sizes of the plurality of hole areas; and
    etching the first layer using the densified first and second resist patterns as etching masks to form a plurality of holes in the first layer,
    wherein the change of the profiles of the plurality of hole areas and the formation of the densified first and second resist patterns are simultaneously performed; and each of the first and second gas plasmas is obtained from a mixture of COS, Ar, $CF_4$, and $O_2$ gases.

10. The method of claim 9, further comprising, after the plurality of holes are formed in the first layer, forming a plurality of capacitor lower electrodes on inner walls of the plurality of holes.

11. The method of claim 9, further comprising, after the plurality of holes are formed in the first layer, forming a plurality of contact plugs in the plurality of holes.

* * * * *